US011606638B2

(12) United States Patent
Koss et al.

(10) Patent No.: US 11,606,638 B2
(45) Date of Patent: *Mar. 14, 2023

(54) WIRELESS EARPHONES WITH DIGITAL SIGNAL PROCESSORS

(71) Applicant: Koss Corporation, Milwaukee, WI (US)

(72) Inventors: Michael J. Koss, Milwaukee, WI (US); Michael J. Pelland, Princeton, WI (US); Michael Sagan, Fairfield, CA (US); Steven R. Reckamp, Crystal Lake, IL (US); Gregory J. Hallingstad, Deforest, WI (US); Jeffrey K. Bovee, Sterling, IL (US); Morgan J. Lowery, Deforest, WI (US)

(73) Assignee: KOSS CORPORATION, Milwaukee, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/818,475

(22) Filed: Aug. 9, 2022

(65) Prior Publication Data

US 2022/0386017 A1 Dec. 1, 2022

Related U.S. Application Data

(63) Continuation of application No. 17/812,911, filed on Jul. 15, 2022, which is a continuation of application (Continued)

(51) Int. Cl.
*H04R 1/10* (2006.01)
*H04M 1/02* (2006.01)
(Continued)

(52) U.S. Cl.
CPC ....... *H04R 1/1041* (2013.01); *G06F 3/04847* (2013.01); *G06F 8/65* (2013.01);
(Continued)

(58) Field of Classification Search
CPC .............................. H04R 1/1016; H04R 5/033
(Continued)

(56) References Cited

U.S. PATENT DOCUMENTS 4,456,795 A 6/1984 Saito
5,721,783 A 2/1998 Anderson
(Continued)

FOREIGN PATENT DOCUMENTS

AT 008799 U1 12/2006
WO 2002017564 A2 2/2002
(Continued)

OTHER PUBLICATIONS

Snapdragon Platform; Qualcomm Chipset Solutions, www.cdmatech.com/snapdragon, p. 1-2.
(Continued)

*Primary Examiner* — Kiet M Doan
(74) *Attorney, Agent, or Firm* — K&L Gates LLP

(57) ABSTRACT

Left and right earphones are independently wireless such that the left and right earphones are not physically connected when worn by a user. Each earphone comprises a speaker, microphone and a body portion with an SOC. Each SOC comprises a wireless communication circuit and a processor. Each processor comprises a digital signal processor for noise cancellation.

53 Claims, 16 Drawing Sheets

Related U.S. Application Data

No. 17/178,946, filed on Feb. 18, 2021, now Pat. No. 11,425,485, which is a continuation of application No. 17/070,363, filed on Oct. 14, 2020, now Pat. No. 10,959,012, which is a continuation of application No. 16/900,035, filed on Jun. 12, 2020, now Pat. No. 10,848,852, which is a continuation of application No. 16/375,879, filed on Apr. 5, 2019, now Pat. No. 10,469,934, which is a continuation of application No. 16/182,927, filed on Nov. 7, 2018, now Pat. No. 10,368,155, which is a continuation of application No. 15/962,305, filed on Apr. 25, 2018, now Pat. No. 10,206,025, which is a continuation of application No. 15/650,362, filed on Jul. 14, 2017, now Pat. No. 9,986,325, which is a continuation of application No. 15/293,785, filed on Oct. 14, 2016, now Pat. No. 9,729,959, which is a continuation of application No. 15/082,040, filed on Mar. 28, 2016, now Pat. No. 9,497,535, which is a continuation of application No. 14/695,696, filed on Apr. 24, 2015, now Pat. No. 9,438,987, which is a continuation of application No. 13/609,409, filed on Sep. 11, 2012, now Pat. No. 9,049,502, which is a continuation of application No. 13/459,291, filed on Apr. 30, 2012, now Pat. No. 8,571,544, which is a continuation of application No. 12/936,488, filed as application No. PCT/US2009/039754 on Apr. 7, 2009, now Pat. No. 8,190,203.

(60) Provisional application No. 61/123,265, filed on Apr. 7, 2008.

(51) Int. Cl.

| | |
|---|---|
| *H04R 5/033* | (2006.01) |
| *H04R 5/04* | (2006.01) |
| *H03K 17/96* | (2006.01) |
| *H04W 4/80* | (2018.01) |
| *H04W 76/20* | (2018.01) |
| *G06F 8/654* | (2018.01) |
| *G06F 3/04847* | (2022.01) |
| *G06F 8/65* | (2018.01) |
| *H04R 3/04* | (2006.01) |
| *H04R 3/00* | (2006.01) |
| *H04W 48/20* | (2009.01) |
| *H03G 3/02* | (2006.01) |
| *H04R 1/02* | (2006.01) |
| *H04H 20/95* | (2008.01) |
| *H04R 25/00* | (2006.01) |
| *H04L 101/668* | (2022.01) |
| *H04W 84/22* | (2009.01) |
| *H04W 84/18* | (2009.01) |
| *H04W 84/12* | (2009.01) |

(52) U.S. Cl.
CPC ............... *G06F 8/654* (2018.02); *H03G 3/02* (2013.01); *H03K 17/9622* (2013.01); *H04H 20/95* (2013.01); *H04M 1/0254* (2013.01); *H04R 1/02* (2013.01); *H04R 1/1083* (2013.01); *H04R 1/1091* (2013.01); *H04R 3/00* (2013.01); *H04R 3/04* (2013.01); *H04R 5/033* (2013.01); *H04R 5/04* (2013.01); *H04W 4/80* (2018.02); *H04W 48/20* (2013.01); *H04W 76/20* (2018.02); *H03K 2217/960785* (2013.01); *H04L 2101/668* (2022.05); *H04R 25/554* (2013.01); *H04R 2201/103* (2013.01); *H04R 2201/107* (2013.01); *H04R 2225/55* (2013.01); *H04R 2420/07* (2013.01); *H04W 84/12* (2013.01); *H04W 84/18* (2013.01); *H04W 84/22* (2013.01)

(58) Field of Classification Search
USPC .......................................... 455/551; 381/348
See application file for complete search history.

(56) References Cited

U.S. PATENT DOCUMENTS

| | | |
|---|---|---|
| 5,761,298 A | 6/1998 | Davis et al. |
| 5,815,582 A | 9/1998 | Claybaugh et al. |
| 5,889,870 A | 3/1999 | Norris |
| 5,960,094 A | 9/1999 | Jensen et al. |
| 5,998,275 A | 12/1999 | Richiuso |
| 6,097,809 A | 8/2000 | Lucey et al. |
| 6,278,786 B1 | 8/2001 | McIntosh |
| 6,295,366 B1 | 9/2001 | Haller et al. |
| 6,499,129 B1 | 12/2002 | Srinivasan et al. |
| 6,690,808 B2 | 2/2004 | Urwyler |
| 6,856,690 B1 | 2/2005 | Skulley |
| 7,039,944 B1 | 5/2006 | Cho et al. |
| 7,065,342 B1 | 6/2006 | Rolf |
| 7,069,452 B1 | 6/2006 | Hind et al. |
| 7,072,686 B1 | 7/2006 | Schrager |
| 7,289,775 B1 | 10/2007 | King et al. |
| 7,343,177 B2 | 3/2008 | Seshadri et al. |
| 7,457,649 B1 | 11/2008 | Wilson |
| 7,551,940 B2 | 6/2009 | Paulson et al. |
| 7,564,989 B2 | 7/2009 | Schanz |
| 7,627,289 B2 | 12/2009 | Huddart |
| 7,738,434 B1 | 6/2010 | Reuss et al. |
| 7,881,745 B1 | 2/2011 | Rao et al. |
| 8,180,078 B2 * | 5/2012 | Zellner ................ H04R 25/554 381/311 |
| 8,311,255 B2 | 11/2012 | Hankey et al. |
| 8,401,219 B2 | 3/2013 | Hankey et al. |
| 9,438,987 B2 | 9/2016 | Koss et al. |
| 9,866,962 B2 | 1/2018 | Boesen |
| 10,206,025 B2 | 2/2019 | Koss et al. |
| 2002/0041697 A1 | 4/2002 | MacDonald et al. |
| 2002/0068610 A1 | 6/2002 | Anvekar et al. |
| 2002/0098878 A1 | 7/2002 | Mooney et al. |
| 2002/0160820 A1 | 10/2002 | Winkler |
| 2002/0197956 A1 | 12/2002 | Annola et al. |
| 2003/0018810 A1 | 1/2003 | Karagiannis et al. |
| 2003/0065805 A1* | 4/2003 | Barnes, Jr. ......... G06Q 30/0643 709/244 |
| 2003/0073460 A1 | 4/2003 | van Pelt et al. |
| 2003/0083058 A1 | 5/2003 | Mayer |
| 2003/0100274 A1 | 5/2003 | Brown |
| 2003/0228019 A1 | 12/2003 | Eichler et al. |
| 2004/0002862 A1* | 1/2004 | Kim ........................ G10L 15/02 704/249 |
| 2004/0032964 A1 | 2/2004 | Liang |
| 2004/0068653 A1 | 4/2004 | Fascenda |
| 2004/0078812 A1 | 4/2004 | Calvert |
| 2004/0133734 A1 | 7/2004 | Jordan et al. |
| 2004/0142693 A1 | 7/2004 | Feder et al. |
| 2004/0165720 A1 | 8/2004 | Paulson et al. |
| 2004/0204168 A1 | 10/2004 | Laurila |
| 2004/0210752 A1 | 10/2004 | Rao |
| 2005/0037818 A1 | 2/2005 | Seshadri et al. |
| 2005/0058313 A1 | 3/2005 | Virgil et al. |
| 2005/0073522 A1 | 4/2005 | Aholainen et al. |
| 2005/0089181 A1 | 4/2005 | Polk, Jr. |
| 2005/0094822 A1 | 5/2005 | Swartz |
| 2005/0160270 A1 | 7/2005 | Goldberg et al. |
| 2005/0201585 A1* | 9/2005 | Jannard ................ H03G 3/348 381/381 |
| 2005/0286466 A1 | 12/2005 | Fagg et al. |
| 2006/0025828 A1 | 2/2006 | Armstrong et al. |
| 2006/0026304 A1 | 2/2006 | Price |
| 2006/0052144 A1 | 3/2006 | Seil et al. |
| 2006/0073787 A1 | 4/2006 | Lair et al. |
| 2006/0083331 A1 | 4/2006 | Kaczynski |

(56) References Cited

U.S. PATENT DOCUMENTS

| | | |
|---|---|---|
| 2006/0141950 A1 | 6/2006 | Kim et al. |
| 2006/0147078 A1 | 7/2006 | Neu et al. |
| 2006/0147079 A1 | 7/2006 | Jaakkola |
| 2006/0160270 A1 | 7/2006 | Brun et al. |
| 2006/0163358 A1 | 7/2006 | Biderman |
| 2006/0166705 A1 | 7/2006 | Seshadri et al. |
| 2006/0166716 A1 | 7/2006 | Sesadri et al. |
| 2006/0206776 A1 | 9/2006 | Nieto |
| 2006/0217827 A1 | 9/2006 | Hsu et al. |
| 2006/0229014 A1 | 10/2006 | Harada et al. |
| 2007/0080934 A1 | 4/2007 | Chen et al. |
| 2007/0092098 A1 | 4/2007 | Kaderavek |
| 2007/0110017 A1 | 5/2007 | Fulknier et al. |
| 2007/0116316 A1 | 5/2007 | Goldberg |
| 2007/0123171 A1 | 5/2007 | Slamka et al. |
| 2007/0136446 A1 | 6/2007 | Rezvani et al. |
| 2007/0143105 A1 | 6/2007 | Braho et al. |
| 2007/0147629 A1 | 6/2007 | Chiloyan |
| 2007/0149261 A1 | 6/2007 | Huddart |
| 2007/0149629 A1 | 6/2007 | Donovan et al. |
| 2007/0162169 A1 | 6/2007 | Watanuki |
| 2007/0165875 A1 | 7/2007 | Rezvani et al. |
| 2007/0167187 A1 | 7/2007 | Rezvani et al. |
| 2007/0206776 A1 | 9/2007 | Petel et al. |
| 2007/0224933 A1 | 9/2007 | Mayer |
| 2007/0253579 A1 | 11/2007 | Liu et al. |
| 2007/0258613 A1 | 11/2007 | Wright |
| 2007/0258614 A1 | 11/2007 | Langberg |
| 2008/0016205 A1 | 1/2008 | Svendsen |
| 2008/0031475 A1 | 2/2008 | Goldstein |
| 2008/0043676 A1 | 2/2008 | Mousseau et al. |
| 2008/0052698 A1 | 2/2008 | Olson et al. |
| 2008/0056526 A1 | 3/2008 | Dunn et al. |
| 2008/0062939 A1 | 3/2008 | Horn et al. |
| 2008/0076489 A1 | 3/2008 | Rosener et al. |
| 2008/0112581 A1 | 5/2008 | Kim et al. |
| 2008/0113689 A1 | 5/2008 | Bailey |
| 2008/0133551 A1 | 6/2008 | Wensley et al. |
| 2008/0166001 A1 | 7/2008 | Hankey et al. |
| 2008/0166005 A1* | 7/2008 | Terlizzi .................. H04R 1/083 381/375 |
| 2008/0194209 A1 | 8/2008 | Haupt et al. |
| 2008/0226094 A1 | 9/2008 | Rutschman |
| 2008/0279409 A1 | 11/2008 | Hupkes |
| 2008/0298613 A1* | 12/2008 | Slamka .................. H04M 1/05 381/311 |
| 2008/0311966 A1 | 12/2008 | Klein |
| 2009/0046869 A1 | 2/2009 | Griffin, Jr. et al. |
| 2009/0048669 A1 | 2/2009 | Flagle et al. |
| 2009/0109894 A1 | 4/2009 | Ueda et al. |
| 2009/0158214 A1* | 6/2009 | Arnold .................. G06F 16/438 715/830 |
| 2010/0151788 A1 | 6/2010 | Rahman et al. |

FOREIGN PATENT DOCUMENTS

| | | |
|---|---|---|
| WO | 2006098584 A1 | 9/2006 |
| WO | 2009126614 A1 | 10/2009 |

OTHER PUBLICATIONS

Advanced Audio Distribution Profile Specification; Adopted version 1.0; release date: May 22, 2003, p. 1-75.

Casali et al., Attenuation Performance of Four Hearing Protectors under Dynamic Movement and Different User Fitting Conditions, Human Factors (Feb. 1990), 32(1):9-25.

Skrainar et al., Do Personal Radio Headsets Provide Hearing Protection?, The Noise and Vibration Control Magazine, Sound and Vibration (May 1985), 19(5):16-19.

Bose, Internet Archive of http://www.bose.com/controller?event=VIEW_PRODUCT_PAGE_EVENT&product-headphones_audio_subcategory (Nov. 1, 2007).

File history for U.S. Appl. No. 60/879,177, filed Jan. 6, 2007.

Jabra BT8010 User Manual, www.jabra.com, 2007, GN Netcom A/S, accessed from www.Manualslib.com, 31 pages.

Jabra BT 620s User Manual, www.jabra.com, 2005, GN Netcom A/S, 30 pages.

CSR BlueCore™ 3-Multimedia External, Single Chip Bluetooth® v1.2 System Production Information Data Sheet for BC352239A Data Sheet, Nov. 2004, 116 pages.

Pogue, David, Grooving and Chatting, All in One, The New York Times, accessed https://www.nytimes.com/2006/07/06/technology/grooving-and-chatting-all-in-one.html, Jul. 6, 2006, 5 pages.

SST datasheet, 2001 Silicon Storage Technology, Inc., 30 pages.

Plantronics 610 User Manual, 2006, Plantronics, Inc., 151 pages.

Plantronics 645 User Manual, 2005, Plantronics, Inc., 32 pages.

Plantronics 925 Data Sheet, 2008, Plantronics, Inc., 2 pages.

IPR2021-00297—Judgment, Final Written Decision in *Bose Corporation* (Petitioner) vs. *Koss Corporation* (Patent Owner), issued by the United States Patent and Trademark Office Before the Patent Trial and Appeal Board, dated May 31, 2022.

IPR2021-00305—Judgment, Final Written Decision in *Bose Corporation* (Petitioner) vs. *Koss Corporation* (Patent Owner), issued by the United States Patent and Trademark Office Before the Patent Trial and Appeal Board, entered May 31, 2022.

Hanlon, Koss Cobalt Wireless Headphones, https://newatlas.com/koss-cobalt-wireless-headphones/5983/ (Aug. 11, 2006), pp. 9.

Murph, Koss Introduces Cobalt Bluetooth Headphones, https://www.engadget.com/2006-08-12-koss-introduces-cobalt-bluetooth-headphones.html (Aug. 12, 2006), pp. 4.

IPR2021-00381—Judgment, Final Written Decision in *Apple, Inc.* (Petitioner) vs. *Koss Corporation* (Patent Owner), issued by the United States Patent and Trademark Office Before the Patent Trial and Appeal Board, entered Jun. 27, 2022.

*Bose Corp.* v. *Koss Corp.*, Case No. IPR2021-00680, Final Written Decision, Paper 37 (PTAB Oct. 7, 2022).

*Bose Corp.* v. *Koss Corp.*, Case No. IPR2021-00612, Final Written Decision, Paper 38 (PTAB Sep. 13, 2022).

*Koss Corp.* v. *Plantronics Inc.*, Case No. 21-cv-03854-JST, Order Granting Motion to Dismiss, Dkt. No. 88 (N.D. Cal. Nov. 16, 2022).

* cited by examiner

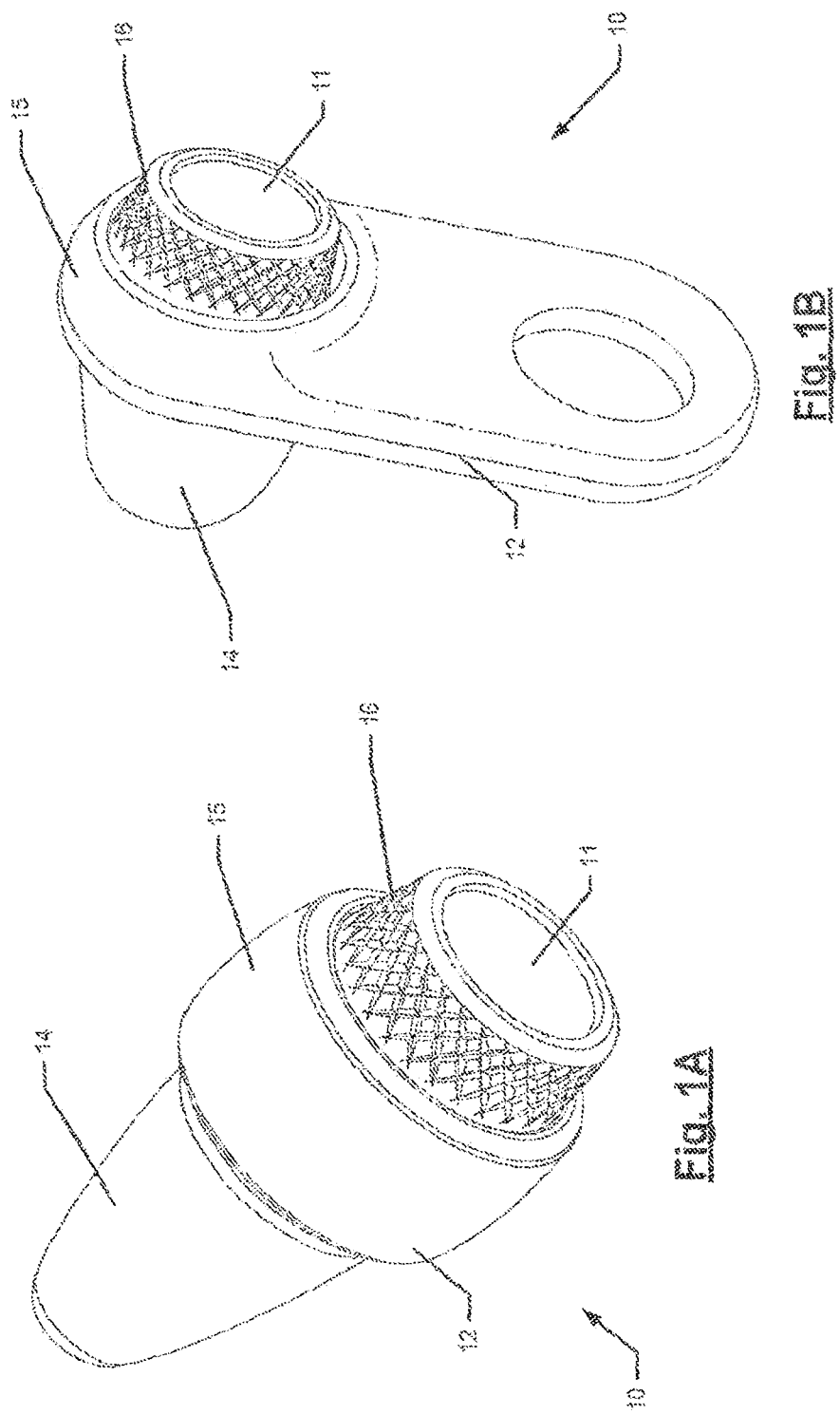

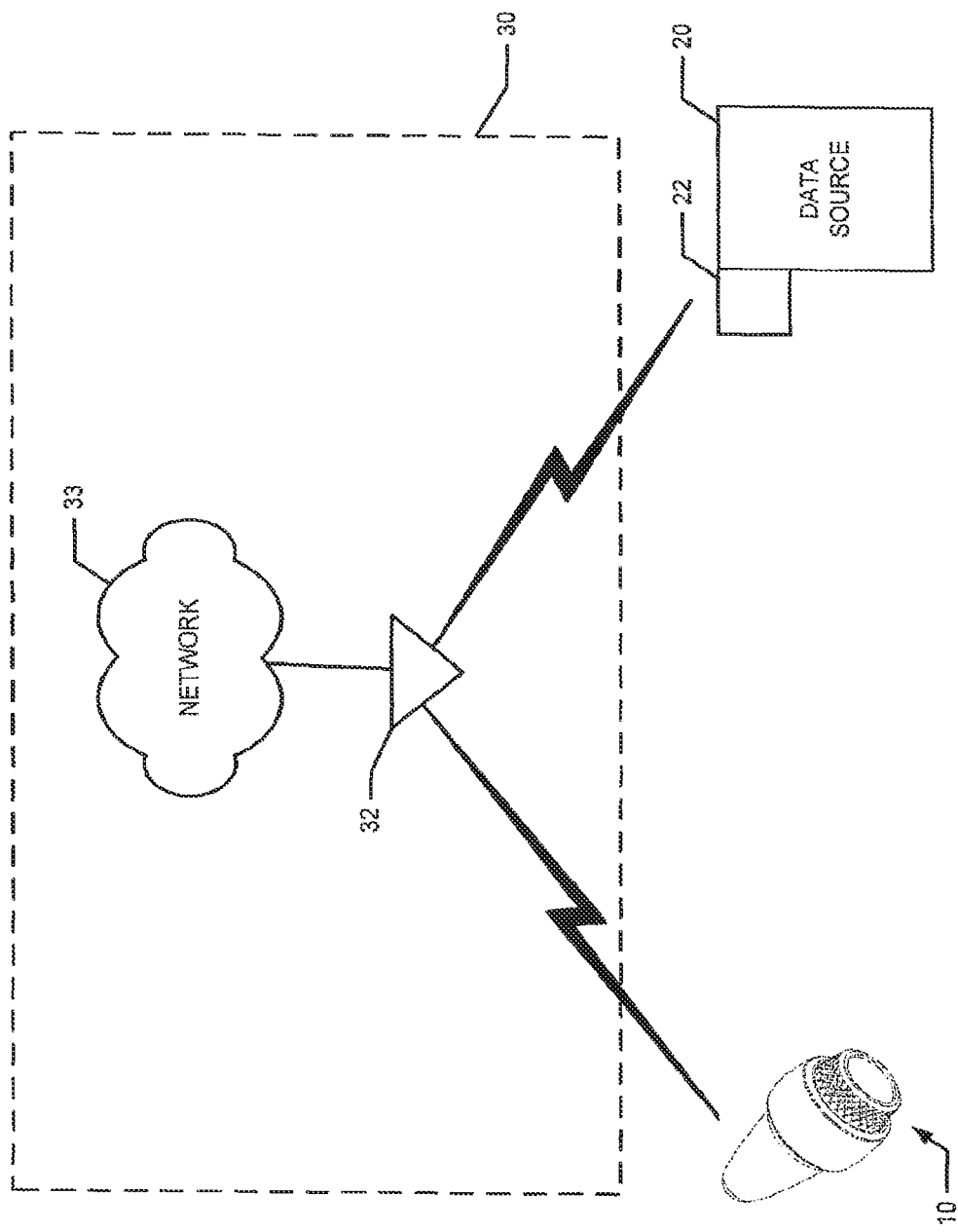

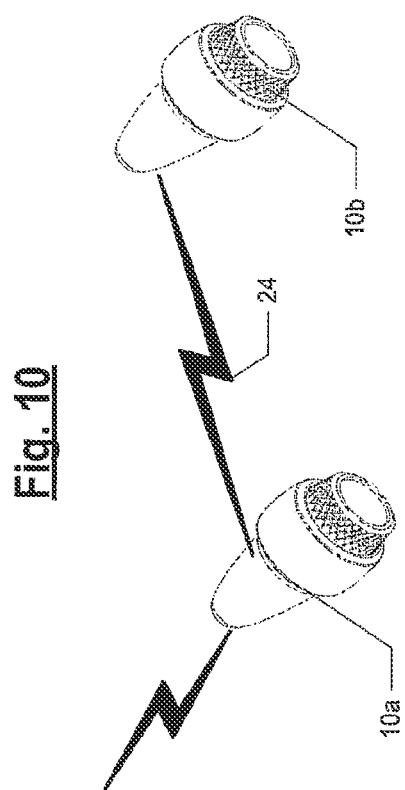

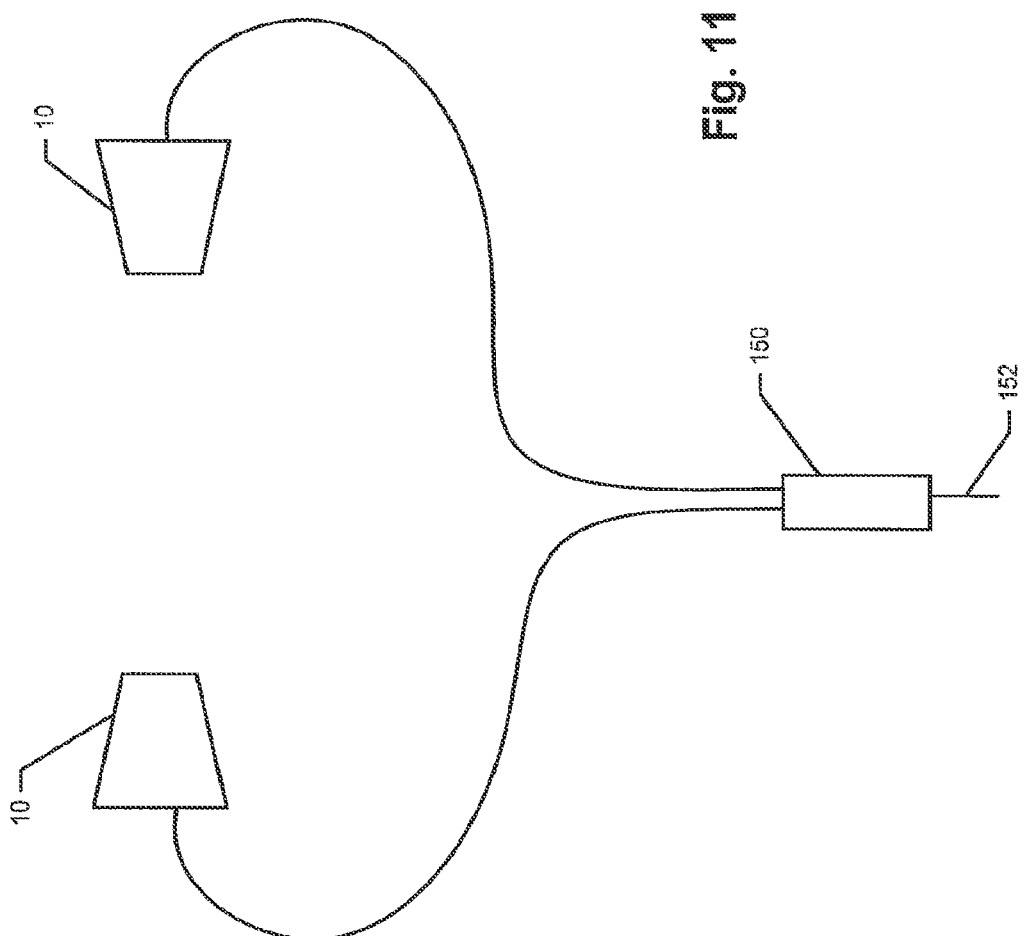

US 11,606,638 B2

WIRELESS EARPHONES WITH DIGITAL SIGNAL PROCESSORS

PRIORITY CLAIM

The present application claims priority as a continuation to U.S. nonprovisional patent application Ser. No. 17/812,911, filed Jul. 15, 2022, which is a continuation of nonprovisional patent application Ser. No. 17/178,946, filed Feb. 18, 2021, now U.S. Pat. No. 11,425,485, issued Aug. 23, 2022, which is a continuation of U.S. nonprovisional patent application Ser. No. 17/070,363, filed Oct. 14, 2020, now U.S. Pat. No. 10,959,012, issued Mar. 23, 2021, which is a continuation of U.S. nonprovisional patent application Ser. No. 16/900,035, filed Jun. 12, 2020, now U.S. Pat. No. 10,848,852, issued Nov. 24, 2020, which is a continuation of U.S. nonprovisional patent application Ser. No. 16/375,879, filed Apr. 5, 2019, now U.S. Pat. No. 10,469,934, issued Nov. 5, 2019, which is a continuation of U.S. nonprovisional patent application Ser. No. 16/182,927, filed Nov. 7, 2018, now U.S. Pat. No. 10,368,155, issued Jun. 30, 2019, which is a continuation of U.S. nonprovisional patent application Ser. No. 15/962,305, filed Apr. 25, 2018, now U.S. Pat. No. 10,206,025, issued Feb. 12, 2019, which is a continuation of U.S. nonprovisional patent application Ser. No. 15/650,362, filed Jul. 14, 2017, now U.S. Pat. No. 9,986,325, issued May 29, 2018, which is a continuation of U.S. nonprovisional patent application Ser. No. 15/293,785, filed Oct. 14, 2016, now U.S. Pat. No. 9,729,959, issued Aug. 8, 2017, which is a continuation of U.S. nonprovisional patent application Ser. No. 15/082,040, filed Mar. 28, 2016, now U.S. Pat. No. 9,497,535, issued Nov. 15, 2016, which is a continuation of U.S. nonprovisional patent application Ser. No. 14/695,696, filed Apr. 24, 2015, now U.S. Pat. No. 9,438,987, issued on Sep. 6, 2016, which is a continuation of U.S. nonprovisional patent application Ser. No. 13/609,409, filed Sep. 11, 2012, now U.S. Pat. No. 9,049,502, issued Jun. 2, 2015, which is a continuation of U.S. nonprovisional patent application Ser. No. 13/459,291, filed Apr. 30, 2012, now U.S. Pat. No. 8,571,544, issued Oct. 29, 2013, which is a continuation of U.S. patent application Ser. No. 12/936,488, filed Dec. 20, 2010, now U.S. Pat. No. 8,190,203, issued May 29, 2012, which is a national stage entry of PCT/US2009/039754, filed Apr. 7, 2009, which claims priority to U.S. provisional patent application Ser. No. 61/123,265, filed Apr. 7, 2008, all of which are incorporated herein by reference in their entireties.

CROSS-REFERENCE TO RELATED APPLICATIONS

U.S. nonprovisional patent application Ser. No. 17/649,928, filed Feb. 4, 2022, now U.S. Pat. No. 11,425,486, issued Aug. 23, 2022, is a continuation of U.S. nonprovisional patent application Ser. No. 17/178,946. U.S. nonprovisional patent application Ser. No. 14/031,938, filed Sep. 13, 2013, now U.S. Pat. No. 8,655,420, issued Feb. 18, 2014, is also a continuation of U.S. nonprovisional patent application Ser. No. 13/609,409, filed Sep. 11, 2012, now U.S. Pat. No. 9,049,502, mentioned above. The present application is also related to the following U.S. applications: Ser. No. 16/528,701, now U.S. Pat. No. 10,491,982, issued Nov. 26, 2019; Ser. No. 16/528,703, now U.S. Pat. No. 10,506,325, issued Dec. 10, 2019; Ser. No. 16/528,705, now U.S. Pat. No. 10,848,850, issued Nov. 24, 2020; Ser. No. 16/528,706, now U.S. Pat. No. 10,757,498, issued Aug. 25, 2020; Ser. No. 16/881,488, now U.S. Pat. No. 10,827,251, issued Nov. 3, 2020; Ser. No. 16/884,691, now U.S. Pat. No. 10,848,851, issued Nov. 24, 2020; and Ser. No. 17/070,295, now U.S. Pat. No. 10,959,011, issued Mar. 23, 2020.

BACKGROUND

Digital audio players, such as MP3 players and iPods, that store and play digital audio files, are very popular. Such devices typically comprise a data storage unit for storing and playing the digital audio, and a headphone set that connects to the data storage unit, usually with a ¼" or a 3.5 mm jack and associated cord. Often the headphones are in-ear type headphones. The cord, however, between the headphones and the data storage unit can be cumbersome and annoying to users, and the length of the cord limits the physical distance between the data storage unit and the headphones. Accordingly, some cordless headphones have been proposed, such as the Monster iFreePlay cordless headphones from Apple Inc., which include a docking port on one of the earphones that can connect directly to an iPod Shuffle. Because they have the docking port, however, the Monster iFreePlay cordless headphones from Apple are quite large and are not in-ear type phones. Recently, cordless headphones that connect wirelessly via IEEE 802.11 to a WLAN-ready laptop or personal computer (PC) have been proposed, but such headphones are also quite large and not in-ear type phones.

SUMMARY

In one general aspect, the present invention is directed to a wireless earphone that comprises a transceiver circuit for receiving streaming audio from a data source, such as a digital audio player or a computer, over an ad hoc wireless network. When the data source and the earphone are out of range via the ad hoc wireless network, they may transition automatically to a common infrastructure wireless network (e.g., a wireless LAN). If there is no common infrastructure wireless network for both the data source and the earphone, the earphone may connect via an available infrastructure wireless network to a host server. The host server may, for example, broadcast streaming audio to the earphone and/or transmit to the earphone a network address (e.g., an Internet Protocol (IP) address) for a network-connected content server that streams digital audio. The earphone may then connect to the content server using the IP address. The content server may be an Internet radio server, including, for example, an Internet radio server that broadcasts streaming audio from the data source or some other content.

These and other advantageous, unique aspects of the wireless earphone are described below.

FIGURES

Various embodiments of the present invention are described herein by way of example in conjunction with the following figures.

FIGS. 1A-1E are views of a wireless earphone according to various embodiments of the present invention.

FIGS. 2A-2D illustrate various communication modes for a wireless earphone according to various embodiments of the present invention.

FIGS. 7, 8 and 10 illustrate communication systems involving the wireless earphone according to various embodiments of the present invention.

FIG. 11 is a diagram of a pair of wireless earphones with a dongle according to various embodiments of the present invention.

DESCRIPTION

Figure 1C:
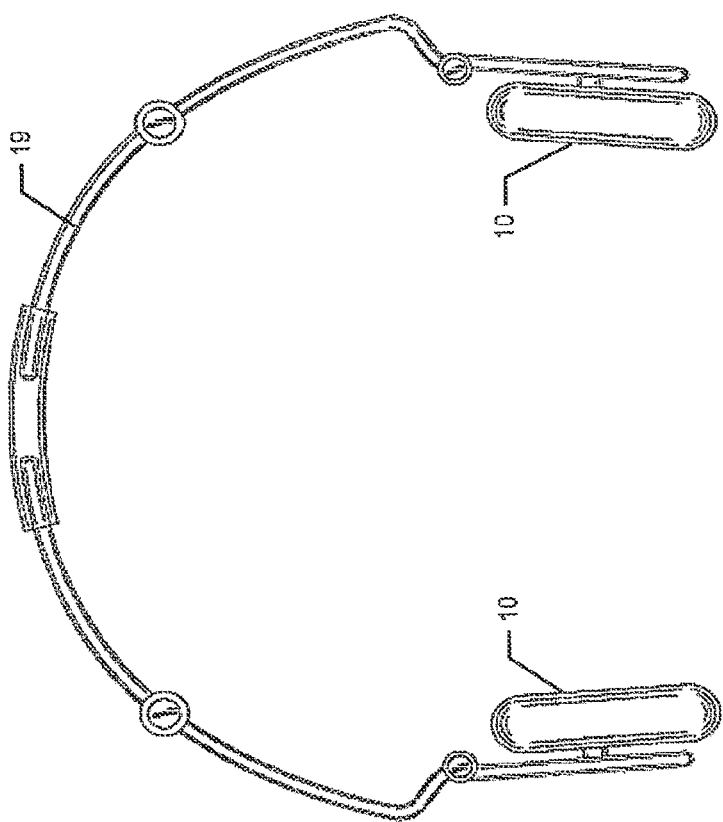

In one general aspect, the present invention is directed to a wireless earphone that receives streaming audio data via ad hoc wireless networks and infrastructure wireless networks, and that transitions seamlessly between wireless networks. The earphone may comprise one or more in-ear, on-ear, or over-ear speaker elements. Two exemplary in-ear earphone shapes for the wireless earphone 10 are shown in FIGS. 1A and 1B, respectively, although in other embodiments the earphone may take different shapes and the exemplary shapes shown in FIGS. 1A and 1B are not intended to be limiting. In one embodiment, the earphone transitions automatically and seamlessly, without user intervention, between communication modes. That is, the earphone may transition automatically from an ad hoc wireless network to an infrastructure wireless network, without user intervention. As used herein, an "ad hoc wireless network" is a network where two (or more) wireless-capable devices, such as the earphone and a data source, communicate directly and wirelessly, without using an access point. An "infrastructure wireless network," on the other hand, is a wireless network that uses one or more access points to allow a wireless-capable device, such as the wireless earphone, to connect to a computer network, such as a LAN or WAN (including the Internet).

FIGS. 1A and 1B show example configurations for a wireless earphone 10 according to various embodiments of the present invention. The examples shown in FIGS. 1A and 1B are not limiting and other configurations are within the scope of the present invention. As shown in FIGS. 1A and 1B, the earphone 10 may comprise a body 12. The body 12 may comprise an ear canal portion 14 that is inserted in the ear canal of the user of the earphone 10. In various embodiments, the body 12 also may comprise an exterior portion 15 that is not inserted into user's ear canal. The exterior portion 15 may comprise a knob 16 or some other user control (such as a dial, a pressure-activated switch, lever, etc.) for adjusting the shape of the ear canal portion 14. That is, in various embodiments, activation (e.g. rotation) of the knob 16 may cause the ear canal portion 14 to change shape so as to, for example, radially expand to fit snugly against all sides of the user's ear canal. Further details regarding such a shape-changing earbud earphone are described in application PCT/US08/88656, filed 31 Dec. 2008, titled "Adjustable Shape Earphone," which is incorporated herein by reference in its entirety. The earphone 10 also may comprise a transceiver circuit housed within the body 12. The transceiver circuit, described further below, may transmit and receive the wireless signals, including receive streaming audio for playing by the earphone 10. The transceiver circuit may be housed in the exterior portion 15 of the earphone 10 and/or in the ear canal portion 14.

Although the example earphones 10 shown in FIGS. 1A and 1B include a knob 16 for adjusting the shape of the ear canal portion 14, the present invention is not so limited, and in other embodiments, different means besides a knob 16 may be used to adjust the ear canal portion 14. In addition, in other embodiments, the earphone 10 may not comprise a shape-changing ear canal portion 14.

In various embodiments, the user may wear two discrete wireless earphones 10: one in each ear. In such embodiments, each earphone 10 may comprise a transceiver circuit. In such embodiments, the earphones 10 may be connected by a string or some other cord-type connector to keep the earphones 10 from being separated.

In other embodiments, as shown in FIG. 1C, a headband 19 may connect the two (left and right) earphones 10. The headband 19 may be an over-the-head band, as shown in the example of FIG. 1C, or the headband may be a behind-the-head band. In embodiments comprising a headband 19, each earphone 10 may comprise a transceiver circuit; hence, each earphone 10 may receive and transmit separately the wireless communication signals. In other embodiments comprising a headband 19, only one earphone 10 may comprise the transceiver circuit, and a wire may run along the headband 19 to the other earphone 10 to connect thereby the transceiver circuit to the acoustic transducer in the earphone that does not comprise the transceiver circuit. The embodiment shown in FIG. 1C comprises on-ear earphones 10; in other embodiments, in-ear or over-ear earphones may be used.

Figure 1E:
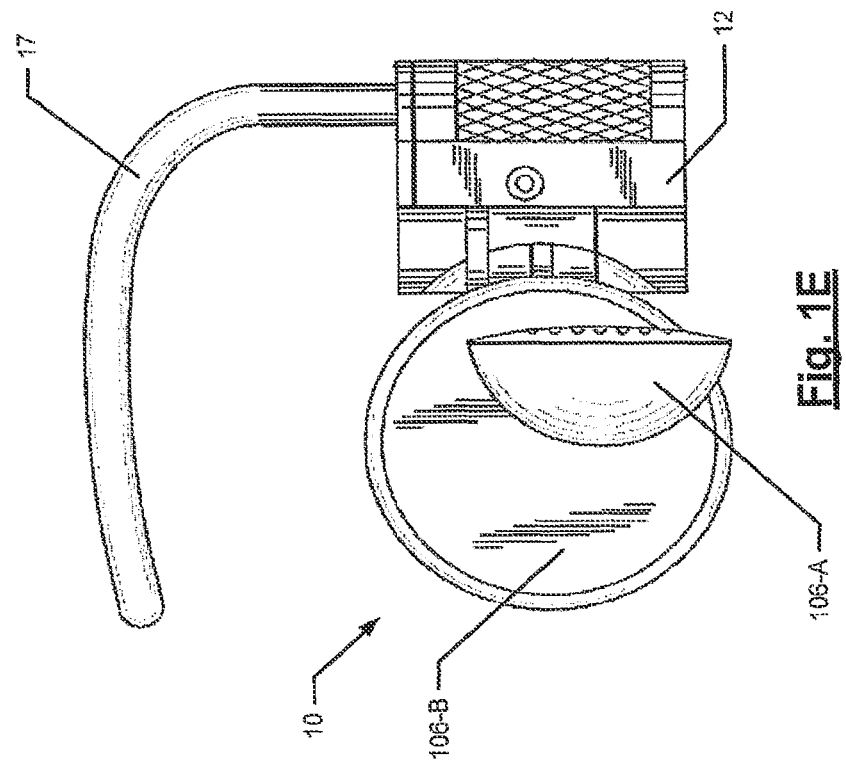
Figure 1D:
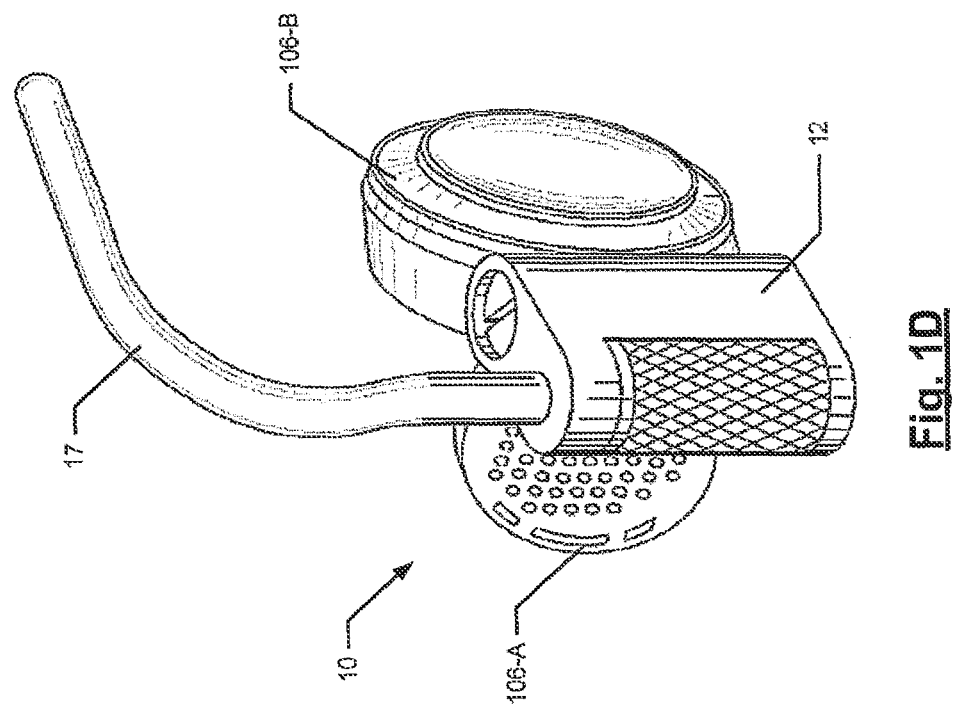

In other embodiments, the earphone 10 may comprise a hanger bar 17 that allows the earphone 10 to clip to, or hang on, the user's ear, as shown in the illustrated embodiment of FIGS. 1D-1E. FIG. 1D is a perspective view of the earphone and FIG. 1E is a side view according to one embodiment. As shown in the illustrated embodiment, the earphone 10 may comprise dual speaker elements 106-A, 106-B. One of the speaker elements (the smaller one) 106-A is sized to fit into the cavum concha of the listener's ear and the other element (the larger one) 106-B is not. The listener may use the hanger bar to position the earphone on the listener's ear. In that connection, the hanger bar may comprise a horizontal section that rests upon the upper external curvature of the listener's ear behind the upper portion of the auricula (or pinna). The earphone may comprise a knurled knob that allows the user to adjust finely the distance between the horizontal section of the hanger bar and the speaker elements, thereby providing, in such embodiments, another measure of adjustability for the user. More details regarding such a dual element, adjustable earphone may be found in U.S. provisional patent application Ser. No. 61/054,238, which is incorporated herein by reference in its entirety.

Figure 2A:
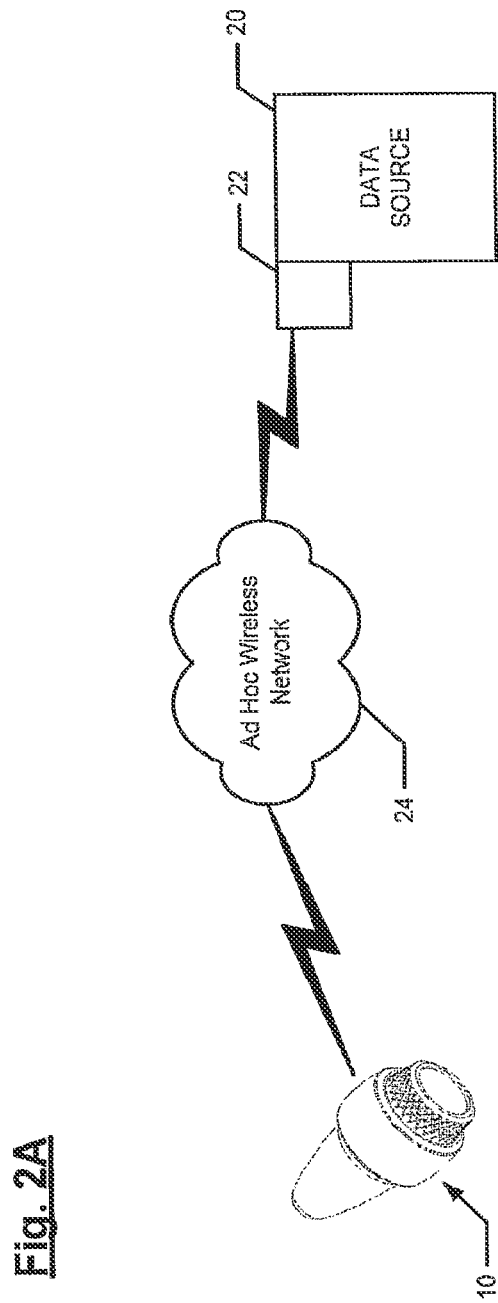

FIGS. 2A-2D illustrate various communication modes for a wireless data communication system involving the earphone 10 according to embodiments of the present invention. As shown in FIG. 2A, the system comprises a data source 20 in communication with the earphone 10 via an ad hoc wireless network 24. The earphone 10, via its transceiver circuit (described in more detail below), may communicate wirelessly with a data source 20, which may comprise a wireless network adapter 22 for transmitting the digital audio wirelessly. For example, the data source 20 may be a digital audio player (DAP), such as an mp3 player or an iPod, or any other suitable digital audio playing device, such as a laptop or personal computer, that stores and/or plays digital audio files. In other embodiments, the data source 20 may generate analog audio, and the wireless network adapter 22 may encode the analog audio into digital format for transmission to the earphone 10.

The wireless network adapter 22 may be an integral part of the data source 20, or it may be a separate device that is connected to the data source 20 to provide wireless connectivity for the data source 20. For example, the wireless network adapter 22 may comprise a wireless network interface card (WNIC) or other suitable transceiver that plugs into a USB port or other port or jack of the data source 20 (such as a TRS connector) to stream data, e.g., digital audio files, via a wireless network (e.g., the ad hoc wireless network 24 or an infrastructure wireless network). The digital audio transmitted from the data source 20 to the earphone 10 via the wireless networks may comprise compressed or uncompressed audio. Any suitable file format may be used for the audio, including mp3, lossy or lossless WMA, Vorbis, Musepack, FLAC, WAV, AIFF, AU, or any other suitable file format.

When in range, the data source 20 may communicate with the earphone 10 via the ad hoc wireless network 24 using any suitable wireless communication protocol, including Wi-Fi (e.g., IEEE 802.11a/b/g/n), WiMAX (IEEE 802.16), Bluetooth, Zigbee, UWB, or any other suitable wireless communication protocol. For purposes of the description to follow, it is assumed that the data source 20 and the earphone 10 communicate using a Wi-Fi protocol, although the invention is not so limited and other wireless communication protocols may be used in other embodiments of the invention. The data source 20 and the earphone 10 are considered in range for the ad hoc wireless network 24 when the signal strengths (e.g., the RSSI) of the signals received by the two devices are above a threshold minimum signal strength level. For example, the data source 20 and the earphone 10 are likely to be in range for an ad hoc wireless network when then are in close proximity, such as when the wearer of the earphone 10 has the data source 20 on his/her person, such as in a pocket, strapped to their waist or arm, or holding the data source in their hand.

When the earphone 10 and the data source 20 are out of range for the ad hoc wireless network 24, that is, when the received signals degrade below the threshold minimum signal strength level, both the earphone 10 and the data source 20 may transition automatically to communicate over an infrastructure wireless network (such as a wireless LAN (WLAN)) 30 that is in the range of both the earphone 10 and the data source 20, as shown in FIG. 2B. The earphone 10 and the data source 20 (e.g., the wireless network adapter 22) may include firmware, as described further below, that cause the components to make the transition to a common infrastructure wireless network 30 automatically and seamlessly, e.g., without user intervention. The earphone 10 may cache the received audio in a buffer or memory for a time period before playing the audio. The cached audio may be played after the connection over the ad hoc wireless network is lost to give the earphone 10 and the data source 20 time to connect via the infrastructure wireless network.

Figure 2C:
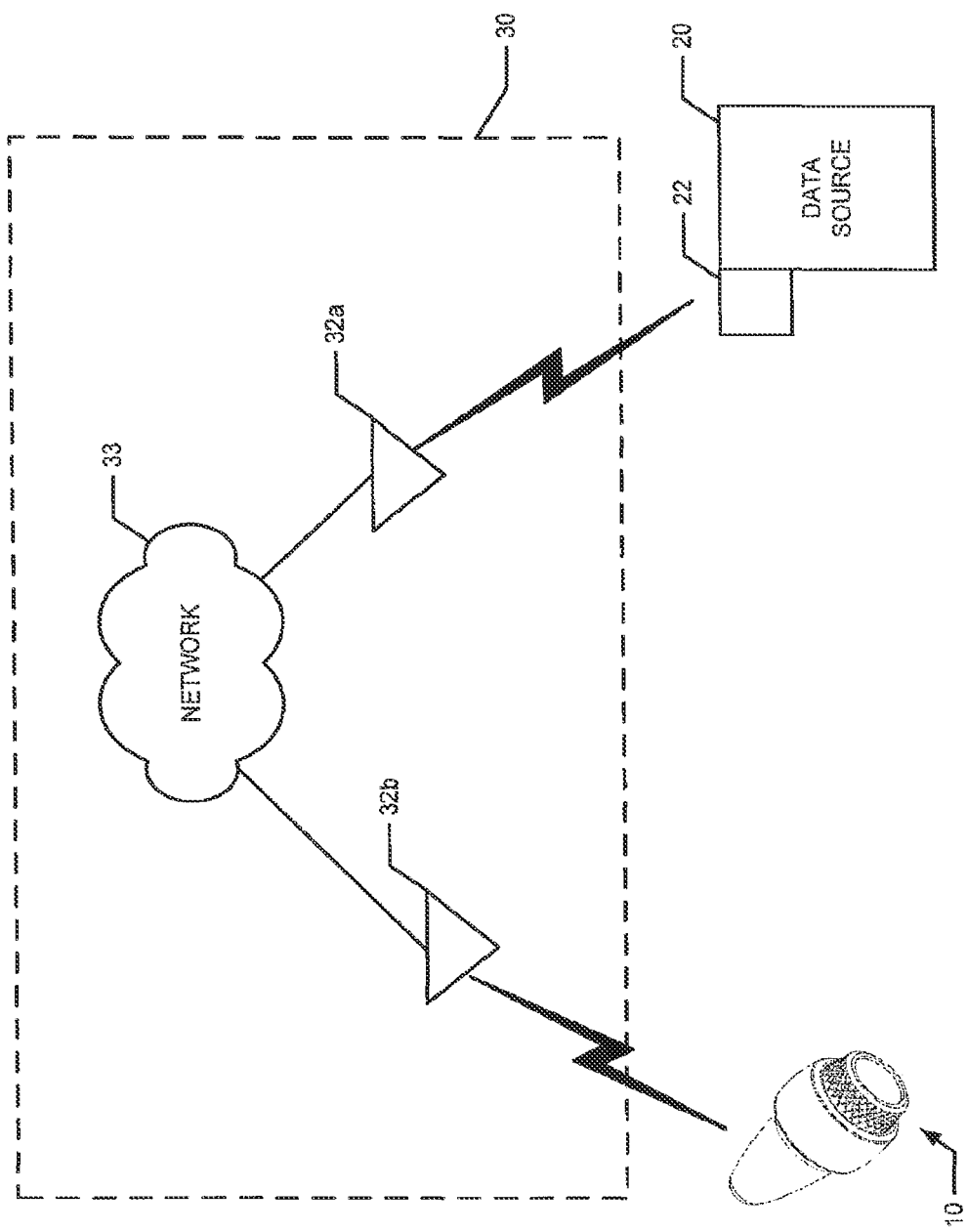

For example, as shown in FIG. 2B, the infrastructure network may comprise an access point 32 that is in the range of both the data source 20 and the earphone 10. The access point 32 may be an electronic hardware device that acts as a wireless access point for, and that is connected to, a wired and/or wireless data communication network 33, such as a LAN or WAN, for example. The data source 20 and the earphone 10 may both communicate wirelessly with the access point 32 using the appropriate network data protocol (a Wi-Fi protocol, for example). The data source 20 and the earphone 10 may both transition automatically to an agreed-upon WLAN 30 that is in the range of both devices when they cannot communicate satisfactorily via the ad hoc wireless network 24. A procedure for specifying an agreed-upon infrastructure wireless network 30 is described further below. Alternatively, the infrastructure wireless network 30 may have multiple access points 32*a-b*, as shown in FIG. 2C. In such an embodiment, the data source 20 may communicate wirelessly with one access point 32*b* and the earphone 10 may communicate wirelessly with another access point 32*a* of the same infrastructure wireless network 30. Again, the data source 20 and the earphone 10 may transition to an agreed-upon WLAN.

Figure 2D:
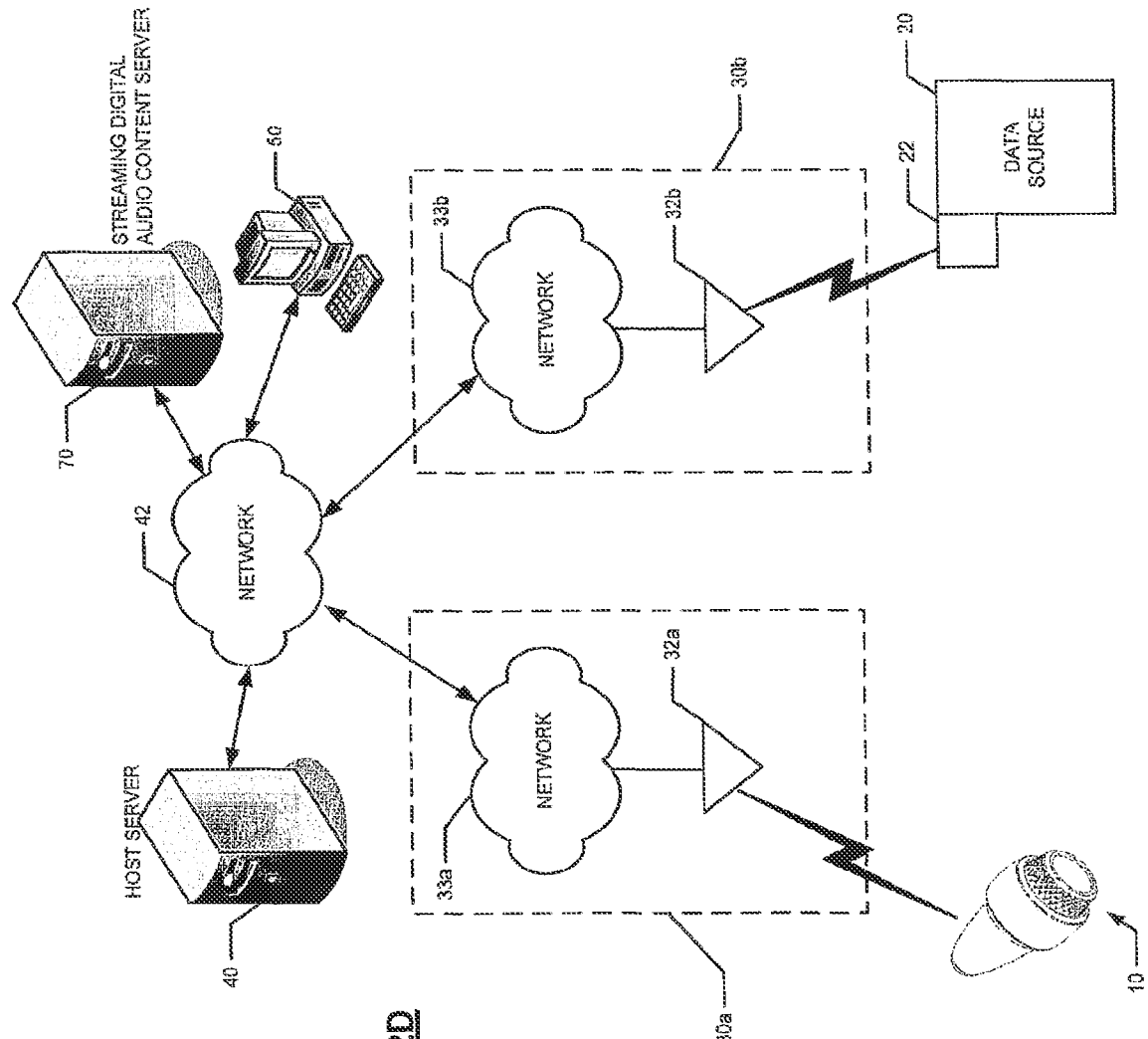

If there is no suitable common infrastructure wireless network over which the earphone 10 and the data source 20 can communicate, as shown in FIG. 2D, the earphone 10 may transition to communicate with an access point 32*a* for an available (first) wireless network (e.g., WLAN) 30*a* that is in the range of the earphone 10. In this mode, the earphone 10 may connect via the wireless network 30*a* to a network-enabled host server 40. The host server 40 may be connected to the wireless network 30*a* via an electronic data communication network 42, such as the Internet. In one mode, the host server 40 may transmit streaming digital audio via the networks 33*a*, 42 to the earphone 10. In another mode, the host server 40 may transmit to the earphone 10 a network address, such as an Internet Protocol (IP) address, for a streaming digital audio content server 70 on the network 42. Using the received IP address, the earphone 10 may connect to the streaming digital audio content server 70 via the networks 30*a*, 42 to receive and process digital audio from the streaming digital audio content server 70.

The digital audio content server 70 may be, for example, an Internet radio station server. The digital audio content server 70 may stream digital audio over the network 42 (e.g., the Internet), which the earphone 10 may receive and process. In one embodiment, the streaming digital audio content server 70 may stream digital audio received by the streaming digital audio content server 70 from the data source 20. For example, where the data source 20 is a wireless-capable device, such as a portable DAP, the data source 20 may connect to the streaming digital audio content server 70 via a wireless network 30*b* and the network 42. Alternatively, where for example the data source 20 is non-wireless-capable device, such as a PC, the data source 20 may have a direct wired connection to the network 42. After being authenticated by the streaming digital audio content server 70, the data source 20 may stream digital audio to the streaming digital audio content server 70, which may broadcast the received digital audio over the network 42 (e.g., the Internet). In such a manner, the user of the earphone 10 may listen to audio from the data source 20 even when (i) the earphone 10 and the data source 20 are not in communication via an ad hoc wireless network 24 and (ii) the earphone 10 and the data source 20 are not in communication via a common local infrastructure wireless network 30.

Figure 3:
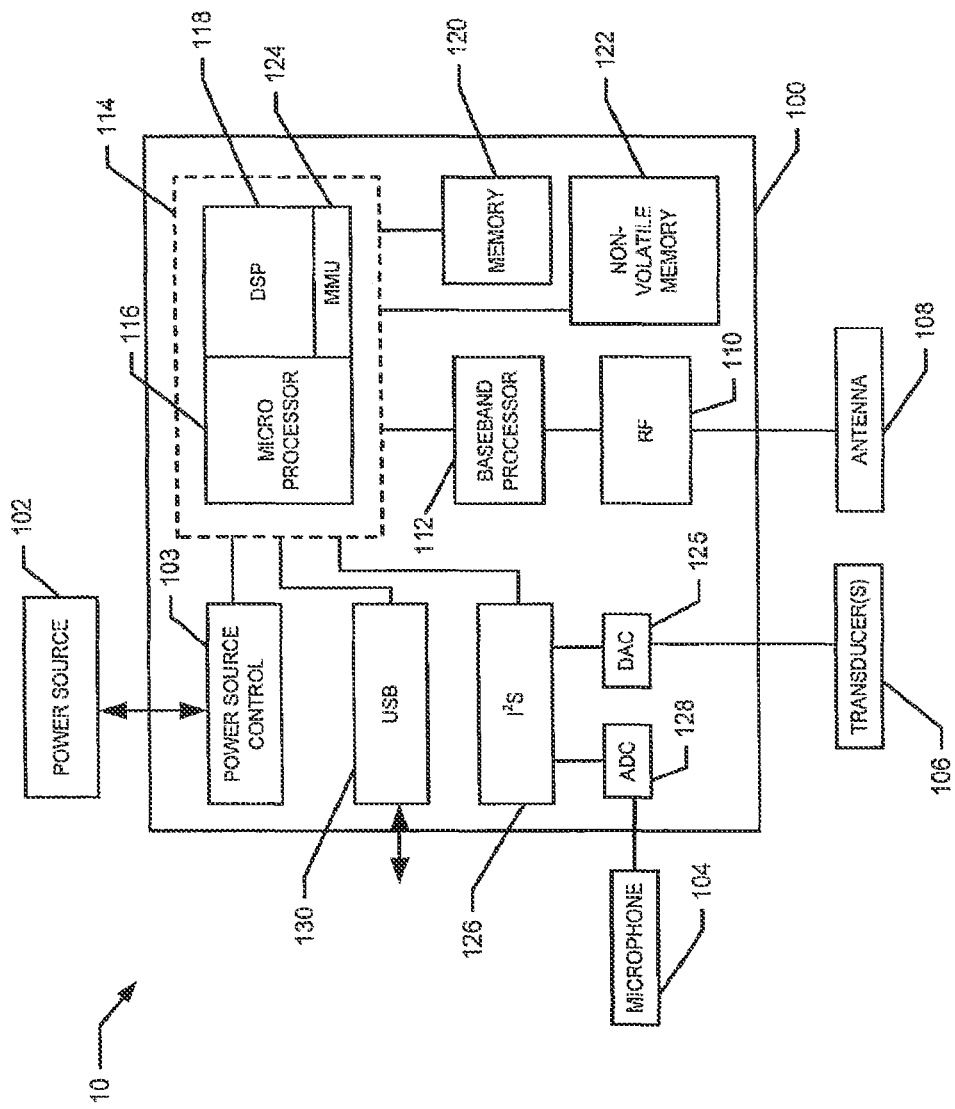
FIG. 3 is a block diagram of a wireless earphone according to various embodiments of the present invention.

FIG. 3 is a block diagram of the earphone 10 according to various embodiments of the present invention. In the illustrated embodiment, the earphone 10 comprises a transceiver circuit 100 and related peripheral components. As shown in FIG. 3, the peripheral components of the earphone 10 may comprise a power source 102, a microphone 104, one or more acoustic transducers 106 (e.g., speakers), and an antenna 108. The transceiver circuit 100 and some of the peripheral components (such as the power source 102 and the acoustic transducers 106) may be housed within the body 12 of the earphone 10 (see FIG. 1). Other peripheral components, such as the microphone 104 and the antenna 108 may be external to the body 12 of the earphone 10. In addition, some of the peripheral components, such as the microphone 104, are optional in various embodiments.

In various embodiments, the transceiver circuit 100 may be implemented as a single integrated circuit (IC), such as a system-on-chip (SoC), which is conducive to miniaturizing the components of the earphone 10, which is advantageous if the earphone 10 is to be relatively small in size, such as an in-ear earphone (see FIGS. 1A-1B for example). In alternative embodiments, however, the components of the transceiver circuit 100 could be realized with two or more discrete ICs or other components, such as separate ICs for the processors, memory, and RF (e.g., Wi-Fi) module, for example.

The power source 102 may comprise, for example, a rechargeable or non-rechargeable battery (or batteries). In other embodiments, the power source 102 may comprise one or more ultracapacitors (sometimes referred to as supercapacitors) that are charged by a primary power source. In embodiments where the power source 102 comprises a rechargeable battery cell or an ultracapacitor, the battery cell or ultracapacitor, as the case may be, may be charged for use, for example, when the earphone 10 is connected to a docking station or computer. The docking station may be connected to or part of a computer device, such as a laptop computer or PC. In addition to charging the rechargeable power source 102, the docking station and/or computer may facilitate downloading of data to and/or from the earphone 10. In other embodiments, the power source 102 may comprise capacitors passively charged with RF radiation, such as described in U.S. Pat. No. 7,027,311. The power source 102 may be coupled to a power source control module 103 of transceiver circuit 100 that controls and monitors the power source 102.

The acoustic transducer(s) 106 may be the speaker element(s) for conveying the sound to the user of the earphone 10. According to various embodiments, the earphone 10 may comprise one or more acoustic transducers 106. For embodiments having more than one transducer, one transducer may be larger than the other transducer, and a crossover circuit (not shown) may transmit the higher frequencies to the smaller transducer and may transmit the lower frequencies to the larger transducer. More details regarding dual element earphones are provided in U.S. Pat. No. 5,333,206, assigned to Koss Corporation, which is incorporated herein by reference in its entirety.

The antenna 108 may receive and transmit the wireless signals from and to the wireless networks 24, 30. A RF (e.g., Wi-Fi) module 110 of the transceiver circuit 100 in communication with the antenna 108 may, among other things, modulate and demodulate the signals transmitted from and received by the antenna 108. The RF module 110 communicates with a baseband processor 112, which performs other functions necessary for the earphone 10 to communicate using the Wi-Fi (or other communication) protocol.

The baseband processor 112 may be in communication with a processor unit 114, which may comprise a microprocessor 116 and a digital signal processor (DSP) 118. The microprocessor 116 may control the various components of the transceiver circuit 100. The DSP 114 may, for example, perform various sound quality enhancements to the digital audio received by the baseband processor 112, including noise cancellation and sound equalization. The processor unit 114 may be in communication with a volatile memory unit 120 and a non-volatile memory unit 122. A memory management unit 124 may control the processor unit's access to the memory units 120, 122. The volatile memory 122 may comprise, for example, a random access memory (RAM) circuit. The non-volatile memory unit 122 may comprise a read only memory (ROM) and/or flash memory circuits. The memory units 120, 122 may store firmware that is executed by the processor unit 114. Execution of the firmware by the processor unit 114 may provide various functionality for the earphone 10, such as the automatic transition between wireless networks as described herein. The memory units 120, 122 may also cache received digital audio.

A digital-to-analog converter (DAC) 125 may convert the digital audio from the processor unit 114 to analog form for coupling to the acoustic transducer(s) 106. An $I^2S$ interface 126 or other suitable serial or parallel bus interface may provide the interface between the processor unit 114 and the DAC 125. An analog-to-digital converter (ADC) 128, which also communicates with the $I^2S$ interface 126, may convert analog audio signals picked up by the microphone 104 for processing by the processor unit 114.

Figure 4A:
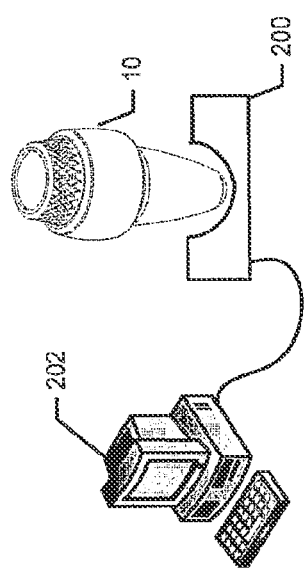
FIGS. 4A-4B show the wireless earphone connected to another device according to various embodiments of the present invention.
Figure 4B:
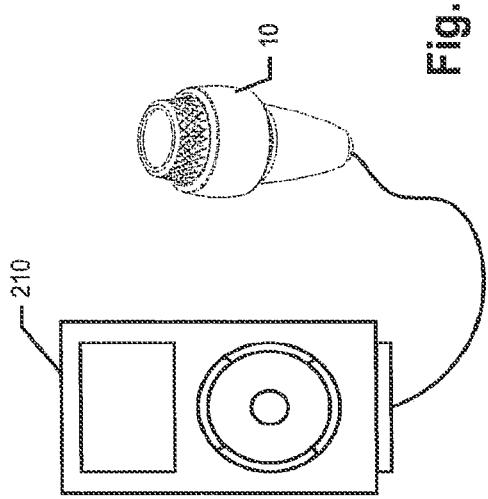

The transceiver circuit 100 also may comprise a USB or other suitable interface 130 that allows the earphone 10 to be connected to an external device via a USB cable or other suitable link. As shown in FIG. 4A, the external device may be a docking station 200 connected to a computer device 202. Also, in various embodiments, the earphone 10 could be connected directly to the computer 202 without the docking station 200. In addition, the external device may be a DAP 210, as shown in FIG. 4B. In that way, the earphone 10 could connect directly to a data source 20, such as the DAP 210 or the computer 202, through the USB port 130. In addition, through the USB port 130, the earphone 10 may connect to a PC 202 or docking station 202 to charge up the power source 102 and/or to get downloads (e.g., data or firmware).

Figure 7:
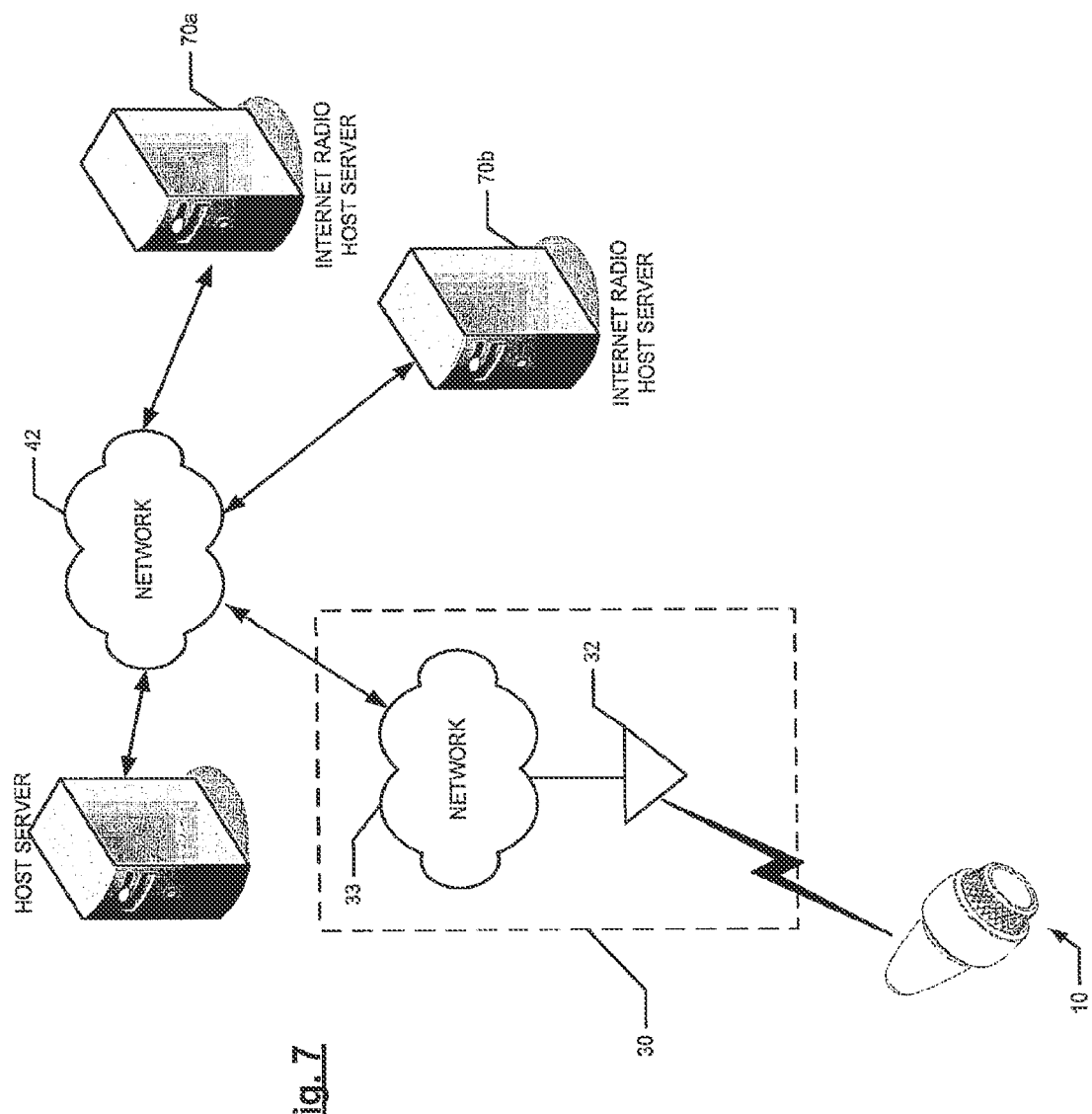

According to various embodiments, the earphone 10 may have an associated web page that a user may access through the host server 40 (see FIG. 2D) or some other server. An authenticated user could log onto the website from a client computing device 50 (e.g., laptop, PC, handheld computer device, etc., including the data source 20) (see FIG. 2D) to access the web page for the earphone 10 to set various profile values for the earphone 10. For example, at the web site, the user could set various content features and filters, as well as adjust various sound control features, such as treble, bass, frequency settings, noise cancellation settings, etc. In addition, the user could set preferred streaming audio stations, such as preferred Internet radio stations or other streaming audio broadcasts. That way, instead of listening to streaming audio from the data source 20, the user could listen to Internet radio stations or other streaming audio broadcasts received by the earphone 10. In such an operating mode, the earphone user, via the web site, may prioritize a number of Internet radio stations or other broadcast sources (hosted by streaming digital audio content servers 70). With reference to FIG. 7, the host server 40 may send the IP address for the earphone user's desired (e.g., highest priority) Internet radio station to the earphone 10. A button 11 on the earphone 10, such as on the rotating dial 16 as shown in the examples of FIGS. 1A and 1B, may allow the user to cycle through the preset preferred Internet radio stations. That is, for example, when the user presses the button 11, an electronic communication may be transmitted to the host server 40 via the wireless network 30, and in response to receiving the communication, the host server 40 may send the IP address for the user's next highest rated Internet radio station via the network 42 to the earphone 10. The earphone 10 may then connect to the streaming digital audio content server 70 for that Internet radio station using the IP address provided by the host server 40. This process may be repeated, e.g., cycled through, for each preset Internet radio station configured by the user of the earphone 10.

At the web site for the earphone 10 hosted on the host server 40, in addition to establishing the identification of digital audio sources (e.g., IDs for the user's DAP or PC) and earphones, the user could set parental or other user controls. For example, the user could restrict certain Internet radio broadcasts based on content or parental ratings, etc. That is, for example, the user could configure a setting through the web site that prevents the host server 40 from sending an IP address for a streaming digital audio content server 70 that broadcasts explicit content based on a rating for the content. In addition, if a number of different earphones 10 are registered to the same user, the user could define separate controls for the different earphones 10 (as well as customize any other preferences or settings particular to the earphones 10, including Internet radio stations, sound quality settings, etc. that would later be downloaded to the earphones 10). In addition, in modes where the host server 40 streams audio to the earphone 10, the host server 40 may log the files or content streamed to the various earphones 10, and the user could view at the web site the files or content that were played by the earphones 10. In that way, the user could monitor the files played by the earphones 10.

Figure 8:
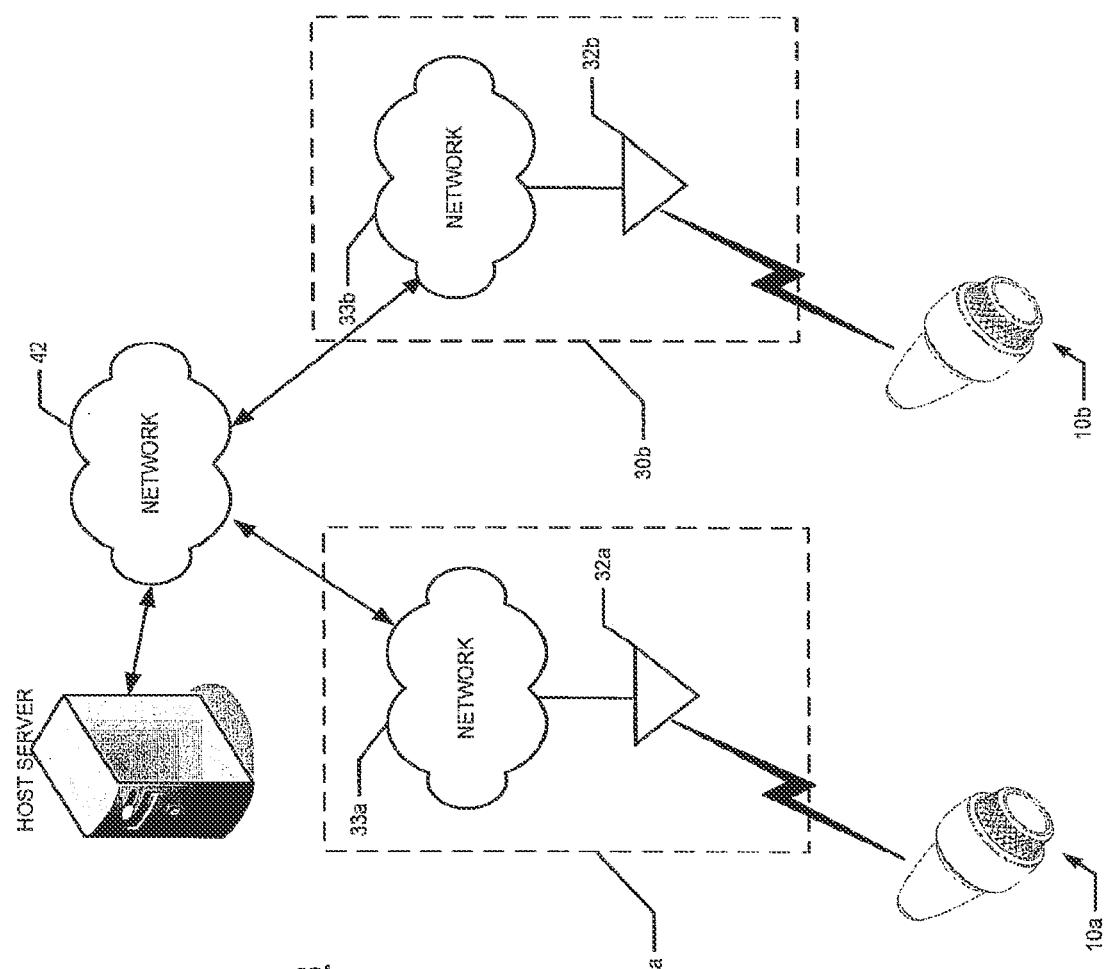

In addition, the host server 40 may provide a so-called eavesdropping function according to various embodiments. The eavesdropping service could be activated via the web site. When the service is activated, the host server 40 may transmit the content that it is delivering to a first earphone 10a to another, second earphone 10b, as shown in FIG. 8. Alternatively, the host server 40 may transmit to the second earphone 10b the most recent IP address for a streaming digital audio content server 70 that was sent to the first earphone 10a. The second earphone 10b may then connect to the streaming digital audio content server 70 that the first earphone 10a is currently connected. That way, the user of the second earphone 10b, which may be a parent, for example, may directly monitor the content being received by the first earphone 10a, which may belong to a child of the parent.

This function also could be present in the earphones 10 themselves, allowing a parent (or other user) to join an ad-hoc wireless network and listen to what their child (or other listener) is hearing. For example, with reference to FIG. 10, a first earphone 10a may receive wireless audio, such as from the data source 20 or some other source, such as the host server 40. The first earphone 10a may be programmed with firmware to broadcast the received audio to a second earphone 10b via an ad hoc wireless network 24. That way, the wearer of the second earphone 10b can monitor in real-time the content being played by the first earphone 10a.

At the web site, the user may also specify the identification number ("ID") of their earphone(s) 10, and the host server 40 may translate the ID to the current internet protocol (IP) addresses for the earphone 10 and for the data source 20. This allows the user to find his or her data source 20 even when it is behind a firewall or on a changing IP address. That way, the host server 40 can match the audio from the data source 20 to the appropriate earphone 10 based on the specified device ID. The user also could specify a number of different data sources 20. For example, the user's DAP may have one specified IP address and the user's home (or work) computer may have another specified IP address. Via the web site hosted by the host server 40, the user could specify or prioritize from which source (e.g., the user's DAP or computer) the earphone 10 is to receive content.

The host server 40 (or some other server) may also push firmware upgrades and/or data updates to the earphone 10 using the IP addresses of the earphone 10 via the networks 30, 42. In addition, a user could download the firmware upgrades and/or data updates from the host server 40 to the client computing device 202 (see FIG. 4A) via the Internet, and then download the firmware upgrades and/or data updates to the earphone 10 when the earphone 10 is connected to the client computer device 202 (such as through a USB port and/or the docking station 200).

Figure 5:
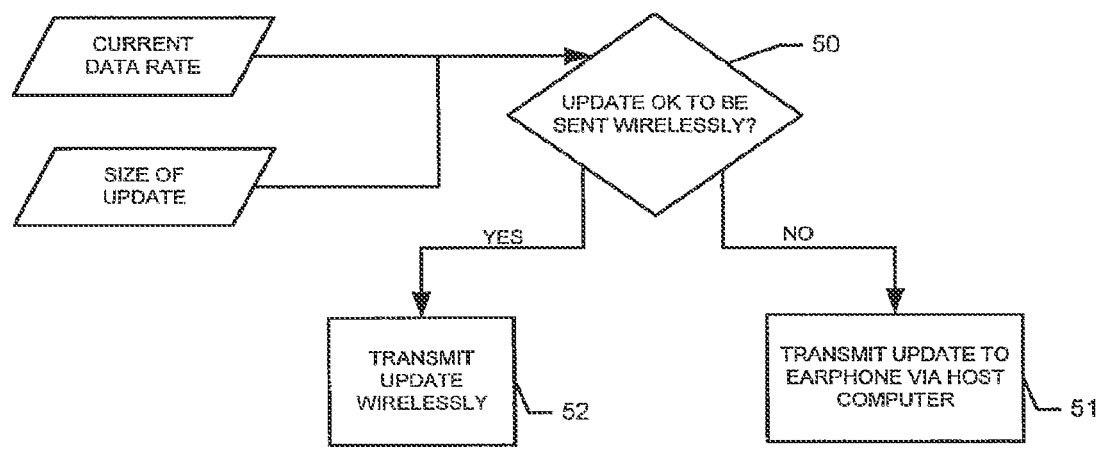
FIG. 5 is a diagram of a process implemented by a host server according to various embodiments of the present invention.

Whether the downloads are transmitted wirelessly to the earphone 10 or via the client computing device 202 may depend on the current data rate of the earphone 10 and the quantity of data to be transmitted to the earphone 10. For example, according to various embodiments, as shown in the process flow of FIG. 5, the host server 40 may be programmed, at step 50, to make a determination, based on the current data rate for the earphone 10 and the size of the update, whether the update should be pushed to the earphone 10 wirelessly (e.g., via the WLAN 30a in FIG. 2D). If the update is too large and/or the current data rate is too low that the performance of the earphone 10 will be adversely affected, the host server 40 may refrain from pushing the update to the earphone 10 wirelessly and wait instead to download the update to the client computing device 202 at step 51. Conversely, if the host server 40 determines that, given the size of the update and the current data rate for the earphone 10 that the performance of the earphone 10 will not be adversely affected, the host server 40 may transmit the update wirelessly to the earphone 10 at step 52.

As mentioned above, the processor unit 114 of the speakerphones 14 may be programmed, via firmware stored in the memory 120, 122, to have the ability to transition automatically from the ad hoc wireless network 24 to an infrastructure wireless network 30 (such as a WLAN) when the quality of the signal on the ad hoc wireless network 24 degrades below a suitable threshold (such as when the data source 20 is out of range for an ad hoc wireless network). In that case, the earphone 10 and the data source 20 may connect to a common infrastructure wireless network (e.g., WLAN) (see, for example, FIGS. 2B-2C). Through the web site for the earphone 10, described above, the user could specify a priority of infrastructure wireless networks 30 for the data source 20 and the earphone 10 to connect to when the ad hoc wireless network 24 is not available. For example, the user could specify a WLAN servicing his/her residence first, a WLAN servicing his/her place of employment second, etc. During the time that the earphone 10 and the data source 20 are connected via the ad hoc wireless network 24, the earphone 10 and the data source 20 may exchange data regarding which infrastructure networks are in range. When the earphone 10 and the data source 20 are no longer in range for the ad hoc wireless network 24 (that is, for example, the signals between the device degrade below an acceptable level), they may both transition automatically to the highest prioritized infrastructure wireless network whose signal strength is above a certain threshold level. That way, even though the earphone 10 and the data source 20 are out of range for the ad hoc wireless network 24, the earphone 10 may still receive the streaming audio from the data source 20 via the infrastructure wireless network 30 (see FIGS. 2B-2C).

When none of the preferred infrastructure networks is in range, the earphone 10 may connect automatically to the host server 40 via an available infrastructure wireless network 30 (see FIG. 2D), e.g., the infrastructure wireless network 30 having the highest RSSI and to which the earphone 10 is authenticated to use. The host server 40, as mentioned above, may transmit IP addresses to the earphone 10 for streaming digital audio content servers 70 or the host sever 40 may stream digital audio to the earphone 10 itself when in this communication mode.

Figure 6:
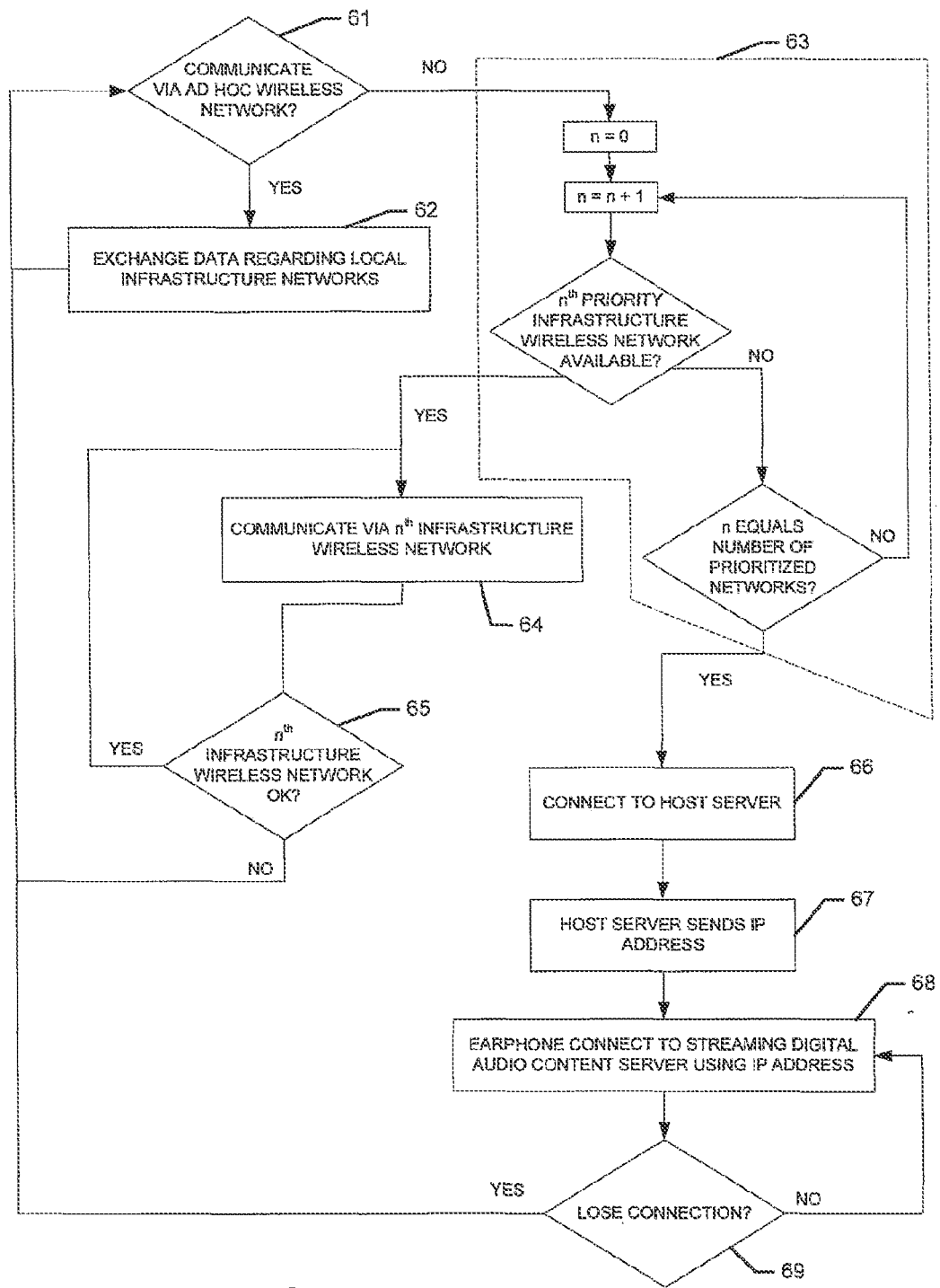
FIG. 6 is a diagram of a process implemented by the wireless earphone to transition automatically between wireless networks according to various embodiments of the present invention.

FIG. 6 is a diagram of the process flow, according to one embodiment, implemented by the transceiver circuit 100 of the earphone 10. The process shown in FIG. 6 may be implemented in part by the processor unit 114 executing firmware stored in a memory unit 120, 122 of the transceiver circuit 100. At step 61, the earphone 10 may determine if it can communicate with the data source 20 via an ad hoc wireless network 24. That is, the earphone 10 may determine if the strength of the wireless signals from the data source 20 exceed some minimum threshold. If so, the data source 20 and the earphone 10 may communicate wirelessly via the ad hoc wireless network 24 (see FIG. 2A). While in this communication mode, at step 62, the data source 20 and the earphone 10 also may exchange data regarding the local infrastructure wireless networks, if any, in the range of the data source 20 and the earphone 10, respectively. For example, the earphone 10 may transmit the ID of local infrastructure wireless networks 30 that the earphone 10 can detect whose signal strength (e.g., RSSI) exceeds some minimum threshold level. Similarly, the data source 20 may transmit the ID the local infrastructure wireless networks 30 that the data source 20 can detect whose signal strength (e.g., RSSI) exceeds some minimum threshold level. The earphone 10 may save this data in a memory unit 120, 122. Similarly, the data source 20 may store in memory the wireless networks that the earphone 10 is detected.

The data source 20 and the earphone 10 may continue to communicate via the ad hoc wireless network mode 24 until they are out of range (e.g., the signal strengths degrade below a minimum threshold level). If an ad hoc wireless network 24 is not available at block 61, the transceiver circuit 100 and the data source 20 may execute a process, shown at block 63, to connect to the user's highest prioritized infrastructure wireless network 30. For example, of the infrastructure wireless networks whose signal strength exceeded the minimum threshold for both the earphone 10 and the data source 20 determined at step 62, the earphone 10 and the data source 20 may both transition to the infrastructure wireless network 30 having the highest priority, as previously set by the user (seen FIGS. 2B-2C, for example). For example, if the user's highest prioritized infrastructure wireless network 30 is not available, but the user's second highest prioritized infrastructure wireless network 30 is, the earphone 10 and the data source 20 may both transition automatically to the user's second highest prioritized infrastructure wireless network 30 at block 64. As shown by the loop with block 65, the earphone 10 and the data source 20 may continue to communicate via one of the user's prioritized infrastructure wireless networks 30 as long as the infrastructure wireless network 30 is available. If the infrastructure wireless network becomes unavailable, the process may return to block 61.

If, however, no ad hoc wireless network and none of the user's prioritized infrastructure wireless networks are available, the earphone 10 may transition automatically to connect to the host server 40 at block 66 (see FIG. 2D) using an available infrastructure wireless network 30. At block 67, the host server 40 may transmit an IP address to the earphone 10 for one of the streaming digital audio content servers 70, and at block 68 the earphone 10 may connect to the streaming digital audio content server 70 using the received IP address. At step 69, as long as the earphone 10 is connected to the streaming digital audio content server 70, the earphone 10 may continue to communicate in this mode. However, if the earphone 10 loses its connection to the digital audio content server 70, the process may return to block 61 in one embodiment. As mentioned above, at block 67, instead of sending an IP address for a streaming digital audio content server 70, the host server 40 may stream digital audio to the earphone 10. The user, when configuring their earphone 10 preferences via the web site, may specify and/or prioritize whether the host server 40 is to send IP addresses for the streaming digital audio content servers 70 and/or whether the host server 40 is to stream audio to the earphone 10 itself.

In another embodiment, the earphone 10 may be programmed to transition automatically to the host server 40 when the earphone 10 and the data source 20 are not in communication via the ad hoc wireless network 24. That is, in such an embodiment, the earphone 10 may not try to connect via a local infrastructure wireless network 30 with the data source 20, but instead transition automatically to connect to the host server 40 (see FIG. 2D).

In various embodiments, as shown in FIG. 1B, the button 11 or other user selection device that allows the wearer of the earphone 10 to indicate approval and/or disapproval of songs or other audio files listened to by the wearer over an Internet radio station. The approval/disapproval rating, along with metadata for the song received by the earphone 10 with the streaming audio, may be transmitted from the transceiver circuit 100 of the earphone 10 back to the host server 40, which may log the songs played as well as the ratings for the various songs/audio files. In addition to being able to view the logs at the website, the host server 40 (or some other server) may send an email or other electronic communication to the earphone user, at a user specified email address or other address, which the user might access from their client communication device 50 (see FIG. 2D). The email or other electronic communication may contain a listing of the song/audio files for which the user gave approval ratings using the button 11 or other user selection device. Further, the email or other electronic communication may provide a URL link for a URL at which the user could download song/audio files that the user rated (presumably song/audio files for which the user gave an approval rating). In some instances, the user may be required to pay a fee to download the song/audio file.

The user song ratings also may be used by the host server 40 to determine the user's musical preferences and offer new music that the user might enjoy. More details about generating user play lists based on song ratings may be found in published U.S. patent applications Pub. No. 2006/0212444, Pub. No. 2006/0206487, and Pub. No. 2006/0212442, and U.S. Pat. No. 7,003,515, which are incorporated herein by reference in their entirety.

In addition or alternatively, the user could log onto a web site hosted by the host server 40 (or some other server) to view the approval/disapproval ratings that the user made via the button 11 on the earphone 10. The web site may provide the user with the option of downloading the rated songs/audio files (for the host server 40 or some other server system) to their client computer device 50. The user could then have their earphone 10 connect to their client computer device 50 as a data source 20 via an ad hoc wireless network 24 (see FIG. 2A) or via an infrastructure wireless network (see FIGS. 2B-2D) to listen to the downloaded songs. In addition, the user could download the song files from their client computer device 50 to their DAP and listen to the downloaded song files from their DAP by using their DAP as the data source 20 in a similar manner.

Another application of the headsets may be in vehicles equipped with Wi-Fi or other wireless network connectivity. Published PCT application WO 2007/136620, which is incorporated herein by reference, discloses a wireless router for providing a Wi-Fi or other local wireless network for a vehicle, such as a car, truck, boat, bus, etc. In a vehicle having a Wi-Fi or other local wireless network, the audio for other media systems in the vehicle could be broadcast over the vehicle's wireless network. For example, if the vehicle comprises a DVD player, the audio from the DVD system could be transmitted to the router and broadcast over the vehicle's network. Similarly, the audio from terrestrial radio stations, a CD player, or an audio cassette player could be broadcast over the vehicle's local wireless network. The vehicle's passengers, equipped with the earphones 10, could cycle through the various audio broadcasts (including the broadcasts from the vehicle's media system as well as broadcasts from the host server 40, for example) using a selection button 11 on the earphone 10. The vehicle may also be equipped with a console or terminal, etc., through which a passenger could mute all of the broadcasts for direct voice communications, for example.

Figure 9:
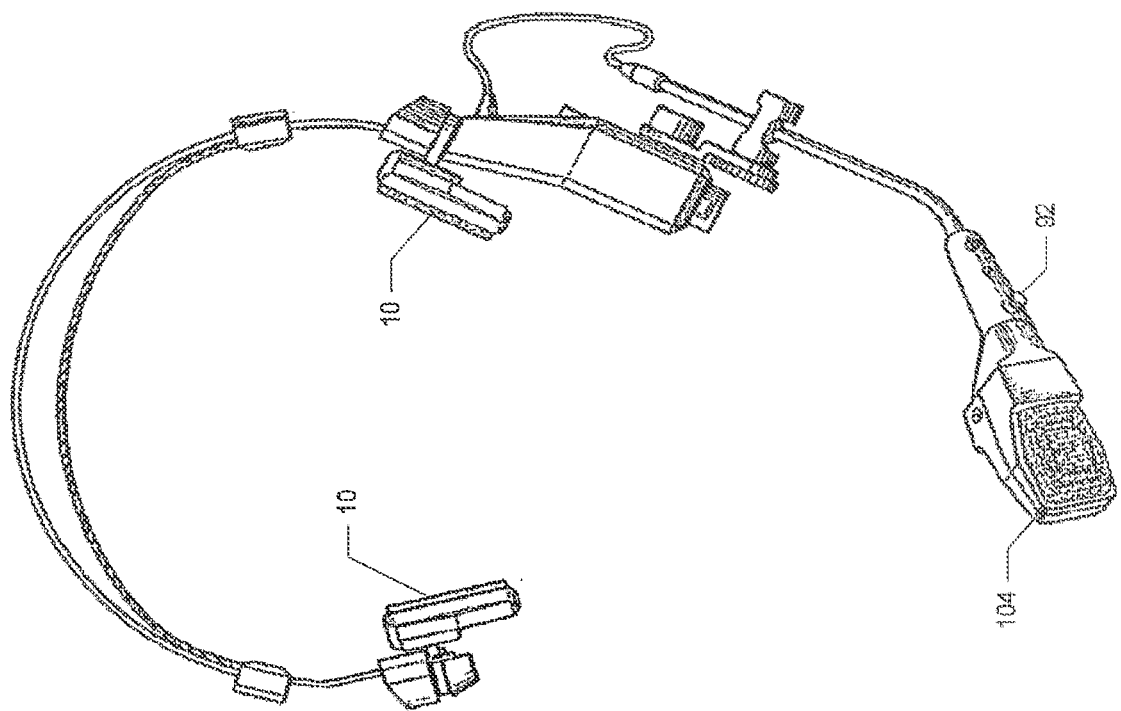
FIG. 9 is a diagram of a headset including a wireless earphone and a microphone according to various embodiments of the present invention.

As described above, the earphones 10 may also include a microphone 104, as shown in the example of FIG. 9. The headset 90 shown in FIG. 9 includes two earphones 10, both of which may include a transceiver circuit 100 or only one of which may include the transceiver circuit, as discussed above. The microphone 104 could be used to broadcast communications from one earphone wearer to another earphone wearer. For example, one wearer could activate the microphone by pressing a button 92 on the headset 90. The headset 90 may then transmit a communication via an ad hoc wireless network 24 or other wireless network to a nearby recipient (or recipients) equipped with a headset 90 with a transceiver circuit 100 in one or both of the earphones 10. When such communication is detected by the recipient's headset 90, the streaming audio received over the wireless network by the recipient's headset 90 may be muted, and the intercom channel may be routed to the transducer(s) of the recipient's headset 90 for playing for the recipient. This functionality may be valuable and useful where multiple wearers of the headsets 90 are in close proximity, such as on motorcycles, for example.

Another exemplary use of the earphones 10 is in a factory, warehouse, construction site, or other environment that might be noisy. Persons (e.g., workers) in the environment could use the earphones 10 for protection from the surrounding noise of the environment. From a console or terminal, a person (e.g., a supervisor) could select a particular recipient for a communication over the Wi-Fi network (or other local wireless network). The console or terminal may have buttons, dials, or switches, etc., for each user/recipient, or it could have one button or dial through which the sender could cycle through the possible recipients. In addition, the console or terminal could have a graphical user interface, through which the sender may select the desired recipient(s).

As mentioned above, the earphones 10 may comprise a USB port. In one embodiment, as shown in FIG. 11, the user may use an adapter 150 that connects to the USB port of each earphone 10. The adapter 150 may also have a plug connector 152, such as a 3.5 mm jack, which allows the user to connect the adapter 150 to devices having a corresponding port for the connector 152. When the earphones 10 detect a connection via their USB interfaces in such a manner, the Wi-Fi (or other wireless protocol) components may shut down or go into sleep mode, and the earphones 10 will route standard headphone level analog signals to the transducer(s) 106. This may be convenient in environments where wireless communications are not permitted, such as airplanes, but where there is a convenient source of audio contact. For example, the adapter 150 could plug into a person's DAP. The DSP 118 of the earphone 10 may still be operational in such a non-wireless mode to provide noise cancellation and any applicable equalization.

The examples presented herein are intended to illustrate potential and specific implementations of the embodiments. It can be appreciated that the examples are intended primarily for purposes of illustration for those skilled in the art. No particular aspect of the examples is/are intended to limit the scope of the described embodiments.

According to various embodiments, therefore, the present invention is directed to an earphone 10 that comprises a body 12, where the body 12 comprises: (i) at least one acoustic transducer 106 for converting an electrical signal to sound; (ii) an antenna 108; and (iii) a transceiver circuit 100 in communication with the at least one acoustic transducer 106 and the antenna 108. The transceiver circuit 100 is for receiving and transmitting wireless signals via the antenna 108, and the transceiver circuit 100 is for outputting the electrical signal to the at least one acoustic transducer 106. The wireless transceiver circuit also comprises firmware, which when executed by the transceiver circuit, causes the transceiver circuit to: (i) receive digital audio wirelessly from a data source 20 via an ad hoc wireless network 24 when the data source 20 is in wireless communication range with the earphone 10 via the ad hoc wireless network 24; and (ii) when the data source 20 is not in wireless communication range with the earphone 10 via the ad hoc wireless network 24, transition automatically to receive digital audio via an infrastructure wireless network 30.

According to various implementations, the data source may comprise a portable digital audio player, such as an MP3 player, iPod, or laptop computer, or a nonportable digital audio player, such as a personal computer. In addition, the transceiver circuit 100 may comprise: (i) a wireless communication module 110 (such as a Wi-Fi or other wireless communication protocol module); (ii) a processor unit 114 in communication with the wireless communication module 110; (iii) a non-volatile memory unit 122 in communication with the processor unit 114; and (iv) a volatile memory 120 unit in communication with the processor unit 114. The infrastructure wireless network may comprise a WLAN. The transceiver circuit 100 may receive digital audio from the data source 20 via the infrastructure wireless network 30 when the data source 20 is not in wireless communication range with the earphone 10 via the ad hoc wireless network 24. The transceiver circuit firmware, when executed by the transceiver circuit 100, may cause the transceiver circuit 100 of the earphone 10 to transition automatically to a pre-set infrastructure wireless network 30 that the data source 20 transitions to when the data source 20 is not in wireless communication range with the earphone 10 via the ad hoc wireless network 24 and when the pre-set infrastructure wireless network 30 is in range of both the earphone 10 and the data source 20. In addition, the transceiver circuit firmware, when executed by the transceiver circuit 100, may cause the transceiver circuit 100 of the earphone 10 to transmit data via the ad hoc wireless network 24 to the data source 20 regarding one or more infrastructure wireless networks 30 detected by the transceiver circuit 100 when the earphone 10 and the data source 20 are communicating via the ad hoc wireless network 24.

In addition, the transceiver circuit firmware, when executed by the transceiver circuit 100, may cause the transceiver circuit 100 of the earphone 10 to connect to a host server 40 via an available infrastructure wireless network 30 when the data source 20 is not in wireless communication range with the earphone 10 via the ad hoc wireless network 24. The earphone 10 may receive streaming digital audio from the host server 40 via the infrastructure wireless network 30. In addition, the earphone 10 may receive a first network address for a first streaming digital audio content server 70 from the host server 40 via the infrastructure wireless network 30. In addition, the earphone 10 may comprise a user control, such as button 11, dial, pressure switch, or other type of user control, that, when activated, causes the earphone 10 to transmit an electronic request via the infrastructure wireless network 30 to the host server 40 for a second network address for a second streaming digital audio content server 70.

In other embodiments, the present invention is directed to a system that comprises: (i) a data source 20 for wirelessly transmitting streaming digital audio; and (ii) a wireless earphone 10 that is in wireless communication with the data source 20. In yet other embodiments, the present invention is directed to a communication system that comprises: (i) a host server 40; (ii) a first streaming digital audio content server 70 that is connected to the host server 40 via a data network 42; and (iii) a wireless earphone 10 that is in communication with the host server 40 via a wireless network 30. The host server 40 is programmed to transmit to the earphone 10 a first network address for the first streaming digital audio content server 70 on the data network 42. The host server 40 and the streaming digital audio content server(s) 70 each may comprise one or more processor circuits and one or more memory circuits (e.g., ROM circuits and/or RAM circuits).

In yet another embodiment, the present invention is directed to a headset that comprises: (i) a first earphone 10a that comprises one or more acoustic transducers 10b for converting a first electrical signal to sound; and (ii) a second earphone 10b, connected to the first earphone 10a, wherein the second earphone 10b comprises one or more acoustic transducers 10b for converting a second electrical signal to sound. In one embodiment, the first earphone 10a comprises: (i) a first antenna 108; and (ii) a first transceiver circuit 100 in communication with the one or more acoustic transducers 106 of the first earphone 10a and in communication with the first antenna 108. The first transceiver circuit 100 is for receiving and transmitting wireless signals via the first antenna 108, and for outputting the first electrical signal to the one or more acoustic transducers 10b of the first earphone 10a. The first transceiver circuit 100 also may comprise firmware, which when executed by the first transceiver circuit 100, causes the first transceiver circuit 100 to: (i) receive digital audio wirelessly from a data source 20 via an ad hoc wireless network 24 when the data source 20 is in wireless communication range with the first earphone 10a via the ad hoc wireless network 24; and (ii) when the data source 20 is not in wireless communication range with the first earphone 10a via the ad hoc wireless network 24, transition automatically to receive digital audio via an infrastructure wireless network 30.

In various implementations, the headset further may comprise a head band 19 that is connected to the first and second earphones 10. In addition, the headset 19 further may comprise a microphone 104 having an output connected to the first transceiver circuit 100. In one embodiment, the first transceiver circuit 100 is for outputting the second electrical signal to the one or more acoustic transducers 106 of the second earphone 10b. In another embodiment, the second earphone 10b comprises: (i) a second antenna 108; and (ii) a second transceiver circuit 100 in communication with the one or more acoustic transducers 106 of the second earphone 10b and in communication with the second antenna 108. The second transceiver circuit 100 is for receiving and transmitting wireless signals via the second antenna 108, and for outputting the second electrical signal to the one or more acoustic transducers 106 of the second earphone 10b. The second transceiver circuit 100 may comprise firmware, which when executed by the second transceiver circuit 100, causes the second transceiver circuit 100 to: (i) receive digital audio wirelessly from the data source 20 via the ad hoc wireless network 24 when the data source 20 is in wireless communication range with the second earphone 10b via the ad hoc wireless network 24; and (ii) when the data source 20 is not in wireless communication range with the second earphone 10b via the ad hoc wireless network 24, transition automatically to receive digital audio via the infrastructure wireless network 30.

In addition, according to various embodiments, the first earphone 10a may comprise a first data port and the second earphone 10b may comprise a second data port. In addition, the headset may further comprise an adapter or dongle 150 connected to the first data port of the first earphone 10a and to the second data port of the second earphone 10b, wherein the adapter 150 comprises an output plug connector 152 for connecting to a remote device.

In addition, according to other embodiments, the present invention is directed to a method that comprises the steps of: (i) receiving, by a wireless earphone, via an ad hoc wireless network, digital audio from a data source when the data source is in wireless communication with the earphone via the ad hoc wireless network; (ii) converting, by the wireless earphone, the digital audio to sound; and (iii) when the data source is not in wireless communication with the earphone, transitioning automatically, by the earphone, to receive digital audio via an infrastructure wireless network.

In various implementations, the step of transitioning automatically by the earphone to receive digital audio via an infrastructure wireless network may comprises transitioning automatically to receive digital audio from the data source via an infrastructure wireless network when the data source is not in wireless communication range with the earphone via the ad hoc wireless network. In addition, the method may further comprise the step of receiving by the wireless earphone from the data source via the ad hoc wireless network data regarding one or more infrastructure wireless networks detected by data source when the earphone and the data source are communicating via the ad hoc wireless network.

In addition, the step of transitioning automatically by the earphone to receive digital audio via an infrastructure wireless network comprises may transitioning automatically to receive digital audio from a host sever via the infrastructure wireless network when the data source is not in wireless communication range with the earphone via the ad hoc wireless network. Additionally, the step of transitioning automatically by the earphone to receive digital audio via an infrastructure wireless network may comprise: (i) receiving, by the wireless earphone via the infrastructure wireless network, from a host server connected to the infrastructure wireless network, a network address for a streaming digital audio content server; and (ii) connecting, by the wireless earphone, to the streaming digital audio content server using the network address received from the host server.

It is to be understood that the figures and descriptions of the embodiments have been simplified to illustrate elements that are relevant for a clear understanding of the embodiments, while eliminating, for purposes of clarity, other elements. For example, certain operating system details for the various computer-related devices and systems are not described herein. Those of ordinary skill in the art will recognize, however, that these and other elements may be desirable in a typical processor or computer system. Because such elements are well known in the art and because they do not facilitate a better understanding of the embodiments, a discussion of such elements is not provided herein.

In general, it will be apparent to one of ordinary skill in the art that at least some of the embodiments described herein may be implemented in many different embodiments of software, firmware and/or hardware. The software and firmware code may be executed by a processor or any other similar computing device. The software code or specialized control hardware that may be used to implement embodiments is not limiting. For example, embodiments described herein may be implemented in computer software using any suitable computer software language type. Such software may be stored on any type of suitable computer-readable medium or media, such as, for example, a magnetic or optical storage medium. The operation and behavior of the embodiments may be described without specific reference to specific software code or specialized hardware components. The absence of such specific references is feasible, because it is clearly understood that artisans of ordinary skill would be able to design software and control hardware to implement the embodiments based on the present description with no more than reasonable effort and without undue experimentation.

Moreover, the processes associated with the present embodiments may be executed by programmable equipment, such as computers or computer systems and/or processors. Software that may cause programmable equipment to execute processes may be stored in any storage device, such as, for example, a computer system (nonvolatile) memory, an optical disk, magnetic tape, or magnetic disk. Furthermore, at least some of the processes may be programmed when the computer system is manufactured or stored on various types of computer-readable media.

A "computer," "computer system," "host," "host server," "server," or "processor" may be, for example and without limitation, a processor, microcomputer, minicomputer, server, mainframe, laptop, personal data assistant (PDA), wireless e-mail device, cellular phone, pager, processor, fax machine, scanner, or any other programmable device configured to transmit and/or receive data over a network. Such components may comprise: one or more processor circuits; and one more memory circuits, including ROM circuits and RAM circuits. Computer systems and computer-based devices disclosed herein may include memory for storing certain software applications used in obtaining, processing, and communicating information. It can be appreciated that such memory may be internal or external with respect to operation of the disclosed embodiments. The memory may also include any means for storing software, including a hard disk, an optical disk, floppy disk, ROM (read only memory), RAM (random access memory), PROM (programmable ROM), EEPROM (electrically erasable PROM) and/or other computer-readable media.

In various embodiments disclosed herein, a single component may be replaced by multiple components and multiple components may be replaced by a single component to perform a given function or functions. Except where such substitution would not be operative, such substitution is within the intended scope of the embodiments. Any servers described herein, such as the host server 40, for example, may be replaced by a "server farm" or other grouping of networked servers (such as server blades) that are located and configured for cooperative functions. It can be appreciated that a server farm may serve to distribute workload between/among individual components of the farm and may expedite computing processes by harnessing the collective and cooperative power of multiple servers. Such server farms may employ load-balancing software that accomplishes tasks such as, for example, tracking demand for processing power from different machines, prioritizing and scheduling tasks based on network demand and/or providing backup contingency in the event of component failure or reduction in operability.

While various embodiments have been described herein, it should be apparent that various modifications, alterations, and adaptations to those embodiments may occur to persons skilled in the art with attainment of at least some of the advantages. The disclosed embodiments are therefore intended to include all such modifications, alterations, and adaptations without departing from the scope of the embodiments as set forth herein.

What is claimed is:

1. Earphones comprising a left earphone and a right earphone, wherein the left and right earphones are independently wireless such that the left and right earphones are not physically connected when worn by a user, wherein:

the left earphone comprises:
   a left-side speaker;
   a left-side microphone;
   a left-side memory, wherein the left earphone is further configured to receive from a remote computing device, and store in the left-side memory, a firmware update; and
   a left-side body portion, wherein the left-side body portion comprises a left-side system-on-chip (SOC), wherein the left-side SOC comprises:
      a left-side wireless communication circuit for receiving signals transmitted wirelessly to the left earphone from a remote source; and
      a left-side processor, wherein the left-side processor comprises a left-side digital signal processor for providing a sound quality enhancement to audio played by the left-side speaker, wherein the sound quality enhancement comprises noise cancellation, and wherein the left-side processor is for executing firmware, including the firmware update, stored in the left-side memory; and the right earphone comprises:
   a right-side speaker;
   a right-side microphone;
   a right-side memory, wherein the right earphone is further configured to receive from the remote computing device, and store in the right-side memory, the firmware update; and
   a right-side body portion, wherein the right-side body portion comprises a right-side SOC, wherein the right-side SOC comprises:
      a right-side wireless communication circuit for receiving signals transmitted wirelessly to the right earphone from the remote source; and a right-side processor, wherein the right-side processor comprises a right-side digital signal processor for providing a sound quality enhancement to audio played by the right-side speaker, wherein the sound quality enhancement comprises noise cancellation, wherein the right-side processor is for executing firmware, including the firmware update, stored in the right-side memory, and wherein the left-side and right-side processors are configured to transition automatically from playing audio content received wirelessly from a first digital audio source via a first wireless communication link to playing audio content received wirelessly from a second digital audio source via a second wireless communication link based on a signal strength level for the second wireless communication link.

2. The earphones of claim 1, wherein:
the left earphone comprises a left-side elongated portion that extends from the left-side body portion such that the left-side elongated portion extends straight downwardly from the left-side body portion when the left earphone is worn by the user; and
the right earphone comprises a right-side elongated portion that extends from the right-side body portion such that the right-side elongated portion extends straight downwardly from the right-side body portion when the right earphone is worn by the user.

3. The earphones of claim 1, wherein:
the left earphone comprises a left-side ear canal portion that extends from the left-side body portion into a left ear of the user when the left earphone is worn by the user; and
the right earphone comprises a right-side ear canal portion that extends from the right-side body portion into a right ear of the user when the right earphone is worn by the user.

4. The earphones of claim 3, wherein:
the left earphone comprises a left-side elongated portion that extends from the left-side body portion such that the left-side elongated portion extends straight downwardly from the left-side body portion when the left earphone is worn by the user; and
the right earphone comprises a right-side elongated portion that extends from the right-side body portion such that the right-side elongated portion extends straight downwardly from the right-side body portion when the right earphone is worn by the user.

5. The earphones of claim 3, wherein:
the left earphone comprises a left-side hanger bar having first and second ends, wherein the first end of the left-side hanger bar is connected to the left-side body portion and the second end is free from physical connections, and wherein the left-side hanger bar is configured to extend from the left-side body portion over a top portion of the left ear of the user when the left earphone is worn by the user; and
the right earphone comprises a right-side hanger bar having first and second ends, wherein the first end of the right-side hanger bar is connected to the right-side body portion and the second end is free from physical connections, and wherein the right-side hanger bar is configured to extend from the right-side body portion over a top portion of the right ear of the user when the right earphone is worn by the user.

6. The earphones of claim 5, wherein the left-side and right-side hanger bars comprise plastic.

7. The earphones of claim 1, wherein:
the left-side SOC comprises a left-side buffer for caching audio content received wirelessly by the left earphone; and
the right-side SOC comprises a right-side buffer for caching audio content received wirelessly by the right earphone.

8. The earphones of claim 1, wherein the audio content comprises losslessly compressed audio content.

9. The earphones of claim 1, wherein the audio content comprises lossy compressed audio content.

10. The earphones of claim 1, wherein the earphones are configured to, in response to detection of an incoming wireless communication to the user:
stop playing audio content streamed wirelessly to the earphones; and
output audio of the incoming wireless communication via the left-side speaker and the right-side speaker.

11. The earphones of claim 10, wherein the audio content comprises losslessly compressed audio content.

12. The earphones of claim 10, wherein the audio content comprises lossy compressed audio content.

13. The earphones of claim 1, wherein the earphones are configured to, upon activation of a user control of the earphones, transmit data wirelessly about the earphones to a remote device.

14. The earphones of claim 1, wherein the earphones are configured to, upon activation of a user control of the earphones, initiate transmission of request to a remote network server.

15. The earphones of claim 1, further comprising a docking station for holding at least the left earphone, wherein the docking station comprises a power cable for connecting to an external device, and wherein the docking station is for charging at least the left earphone when the left earphone is placed in the docking station.

16. The earphones of claim 1, wherein the left and right earphones are for playing losslessly compressed audio transmitted to the left and right earphones from the remote source that is in wireless communication with the left and right earphones.

17. The earphones of claim 16, wherein the remote source is a remote streaming audio server.

18. The earphones of claim 16, wherein the remote source is a mobile device.

19. The earphone of claim 1, wherein the left and right earphones are for playing lossy compressed audio transmitted to the left and right earphones from the remote source that is in wireless communication with the left and right earphones.

20. The earphones of claim 19, wherein the remote source is a remote streaming audio server.

21. The earphones of claim 19, wherein the remote source is a mobile device.

22. A system comprising:
a mobile computing device of a first user; and
earphones that communicate wirelessly with the mobile computing device via a wireless data communication link, wherein the earphones comprise a left earphone and a right earphone, wherein the left and right earphones are independently wireless such that the left and right earphones are not physically connected when worn by a user, wherein:

the left earphone comprises:
  a left-side speaker;
  a left-side microphone;
  a left-side memory, wherein the left earphone is further configured to receive from a remote computing device, and store in the left-side memory, a firmware update; and
  a left-side body portion, wherein the left-side body portion comprises a left-side system-on-chip (SOC), wherein the left-side SOC comprises:
    a left-side wireless communication circuit for receiving audio content transmitted wirelessly to the left earphone from the mobile computing device; and
    a left-side processor, wherein the left-side processor comprises a left-side digital signal processor for providing a sound quality enhancement to the audio content when played by the left-side speaker, wherein the sound quality enhancement comprises noise cancellation, and wherein the left-side processor is for executing firmware, including the firmware update, stored in the left-side memory; and
the right earphone comprises:
  a right-side speaker;
  a right-side microphone;
  a right-side memory, wherein the right earphone is further configured to receive from the remote computing device, and store in the right-side memory, the firmware update; and
  a right-side body portion, wherein the right-side body portion comprises a right-side SOC, wherein the right-side SOC comprises:
    a right-side wireless communication circuit for receiving the audio content transmitted wirelessly to the right earphone from the mobile computing device; and
    a right-side processor, wherein the right-side processor comprises a right-side digital signal processor for providing a sound quality enhancement to the audio content when played by the right-side speaker, wherein the sound quality enhancement comprises noise cancellation, wherein the right-side processor is for executing firmware, including the firmware update, stored in the right-side memory, and
wherein the left-side and right-side processors are configured to transition automatically from playing audio content received wirelessly from a first digital audio source via a first wireless communication link to playing audio content received wirelessly from the first digital audio source via a second wireless communication link based on a signal strength level for the second wireless communication link.

23. The system of claim 22, wherein the mobile computer device comprises a screen that is configured to display a graphical user interface through which a user of the earphones selects an audio control setting for the earphones to be applied to the earphones when the earphones receive the audio control setting via the wireless data communication link.

24. The system of claim 22, wherein the mobile computer device comprises a screen that is configured to display a graphical user interface for receiving an activation for the audio content transmitted to the earphones to be transmitted simultaneously to a second set of earphones of a second user, such that, in response to the activation, the earphone and the second set of earphones play the audio content simultaneously for the first and second users.

25. The system of claim 22, further comprising a docking station for holding at least the left earphone, wherein the docking station comprises a power cable for connecting to an external device, and wherein the docking station is for charging at least the left earphone when the left earphone is placed in the docking station.

26. The system of claim 22, further comprising a remote network server that is in communication wirelessly with the mobile computing device.

27. The system of claim 26, wherein, upon activation of a user control of the earphones, the earphones are configured to initiate transmission of a request to the remote network server.

28. Earphones comprising a left earphone and a right earphone, wherein the left and right earphones are independently wireless such that the left and right earphones are not physically connected when worn by a user, wherein:
the left earphone comprises:
  a left-side speaker;
  a left-side microphone;
  a left-side memory, wherein the left earphone is further configured to receive from a remote computing device, and store in the left-side memory, a firmware update; and
  a left-side body portion, wherein the left-side body portion comprises a left-side system-on-chip (SOC), wherein the left-side SOC comprises:
    a left-side wireless communication circuit for receiving signals transmitted wirelessly to the left earphone from a remote source; and
    a left-side processor, wherein the left-side processor comprises a left-side digital signal processor for providing a sound quality enhancement to audio played by the left-side speaker, wherein the sound quality enhancement comprises noise cancellation, and wherein the left-side processor is for executing firmware, including the firmware update, stored in the left-side memory; and
the right earphone comprises:
  a right-side speaker;
  a right-side microphone;
  a right-side memory, wherein the right earphone is further configured to receive from the remote computing device, and store in the right-side memory, the firmware update; and
  a right-side body portion, wherein the right-side body portion comprises a right-side SOC, wherein the right-side SOC comprises:
    a right-side wireless communication circuit for receiving signals transmitted wirelessly to the right earphone from the remote source; and
    a right-side processor, wherein the right-side processor comprises a right-side digital signal processor for providing a sound quality enhancement to audio played by the right-side speaker, wherein the sound quality enhancement comprises noise cancellation, wherein the right-side processor is for executing firmware, including the firmware update, stored in the right-side memory, and
wherein the left-side and right-side processors are configured to transition automatically from playing audio content received wirelessly from a first digital audio source via a first wireless communication link to playing audio content received wirelessly from the first digital audio source via a second wireless communication link based on a signal strength level for the second wireless communication link.

29. The earphones of claim 28, wherein:
the left earphone comprises a left-side elongated portion that extends from the left-side body portion such that the left-side elongated portion extends straight downwardly from the left-side body portion when the left earphone is worn by the user; and
the right earphone comprises a right-side elongated portion that extends from the right-side body portion such that the right-side elongated portion extends straight downwardly from the right-side body portion when the right earphone is worn by the user.

30. The earphones of claim 28, wherein:
the left earphone comprises a left-side ear canal portion that extends from the left-side body portion into a left ear of the user when the left earphone is worn by the user; and
the right earphone comprises a right-side ear canal portion that extends from the right-side body portion into a right ear of the user when the right earphone is worn by the user.

31. The earphones of claim 30, wherein:
the left earphone comprises a left-side elongated portion that extends from the left-side body portion such that the left-side elongated portion extends straight downwardly from the left-side body portion when the left earphone is worn by the user; and
the right earphone comprises a right-side elongated portion that extends from the right-side body portion such that the right-side elongated portion extends straight downwardly from the right-side body portion when the right earphone is worn by the user.

32. The earphones of claim 30, wherein:
the left earphone comprises a left-side hanger bar having first and second ends, wherein the first end of the left-side hanger bar is connected to the left-side body portion and the second end is free from physical connections, and wherein the left-side hanger bar is configured to extend from the left-side body portion over a top portion of the left ear of the user when the left earphone is worn by the user; and
the right earphone comprises a right-side hanger bar having first and second ends, wherein the first end of the right-side hanger bar is connected to the right-side body portion and the second end is free from physical connections, and wherein the right-side hanger bar is configured to extend from the right-side body portion over a top portion of the right ear of the user when the right earphone is worn by the user.

33. The earphones of claim 32, wherein the left-side and right-side hanger bars comprise plastic.

34. The earphones of claim 28, wherein:
the left-side SOC comprises a left-side buffer for caching audio content received wirelessly by the left earphone; and
the right-side SOC comprises a right-side buffer for caching audio content received wirelessly by the right earphone.

35. The earphones of claim 28, wherein the audio content comprises losslessly compressed audio content.

36. The earphones of claim 28, wherein the audio content comprises lossy compressed audio content.

37. The earphones of claim 28, wherein the earphones are configured to, in response to detection of an incoming wireless communication to the user:
stop playing audio content streamed wirelessly to the earphones; and
output audio of the incoming wireless communication via the left-side speaker and the right-side speaker.

38. The earphones of claim 28, wherein the earphones are configured to, upon activation of a user control of the earphones, transmit data wirelessly about the earphones to a remote device.

39. The earphones of claim 28, wherein the earphones are configured to, upon activation of a user control of the earphones, initiate transmission of request to a remote network server.

40. The earphones of claim 28, further comprising a docking station for holding at least the left earphone, wherein the docking station comprises a power cable for connecting to an external device, and wherein the docking station is for charging at least the left earphone when the left earphone is placed in the docking station.

41. Earphones comprising a left earphone and a right earphone, wherein the left and right earphones are independently wireless such that the left and right earphones are not physically connected when worn by a user, wherein:
the left earphone comprises:
 a left-side speaker;
 a left-side microphone;
 a left-side memory, wherein the left earphone is further configured to receive from a remote computing device, and store in the left-side memory, a firmware update; and
 a left-side body portion, wherein the left-side body portion comprises a left-side system-on-chip (SOC), wherein the left-side SOC comprises:
  a left-side wireless communication circuit for receiving signals transmitted wirelessly to the left earphone from a remote source; and
  a left-side processor, wherein the left-side processor comprises a left-side digital signal processor for providing a sound quality enhancement to audio played by the left-side speaker, wherein the sound quality enhancement comprises noise cancellation, and wherein the left-side processor is for executing firmware, including the firmware update, stored in the left-side memory; and
the right earphone comprises:
 a right-side speaker;
 a right-side microphone;
 a right-side memory, wherein the right earphone is further configured to receive from the remote computing device, and store in the right-side memory, the firmware update; and
 a right-side body portion, wherein the right-side body portion comprises a right-side SOC, wherein the right-side SOC comprises:
  a right-side wireless communication circuit for receiving signals transmitted wirelessly to the right earphone from the remote source; and
  a right-side processor, wherein the right-side processor comprises a right-side digital signal processor for providing a sound quality enhancement to audio played by the right-side speaker, wherein the sound quality enhancement comprises noise cancellation, and wherein the right-side processor is for executing firmware, including the firmware update, stored in the right -side memory,
wherein the left and right earphones are for playing lossy compressed audio transmitted to the left and right earphones from the remote source that is in wireless communication with the left and right earphones, and wherein the left-side and right-side processors transition automatically from playing audio content received wirelessly from a first digital audio source via a first wireless communication link to playing audio content received wirelessly from a second digital audio source via a second wireless communication link based on a signal strength level for the second wireless communication link.

42. The earphones of claim 41, wherein the remote source is a remote streaming audio server.

43. The earphones of claim 41, wherein the remote source is a mobile device.

44. The earphones of claim 41, wherein:
the left earphone comprises a left-side elongated portion that extends from the left-side body portion such that the left-side elongated portion extends straight downwardly from the left-side body portion when the left earphone is worn by the user; and
the right earphone comprises a right-side elongated portion that extends from the right-side body portion such that the right-side elongated portion extends straight downwardly from the right-side body portion when the right earphone is worn by the user.

45. The earphones of claim 41, wherein:
the left earphone comprises a left-side ear canal portion that extends from the left-side body portion into a left ear of the user when the left earphone is worn by the user; and
the right earphone comprises a right-side ear canal portion that extends from the right-side body portion into a right ear of the user when the right earphone is worn by the user.

46. The earphones of claim 45, wherein:
the left earphone comprises a left-side elongated portion that extends from the left-side body portion such that the left-side elongated portion extends straight downwardly from the left-side body portion when the left earphone is worn by the user; and
the right earphone comprises a right-side elongated portion that extends from the right-side body portion such that the right-side elongated portion extends straight downwardly from the right-side body portion when the right earphone is worn by the user.

47. The earphones of claim 45, wherein:
the left earphone comprises a left-side hanger bar having first and second ends, wherein the first end of the left-side hanger bar is connected to the left-side body portion and the second end is free from physical connections, and wherein the left-side hanger bar is configured to extend from the left-side body portion over a top portion of the left ear of the user when the left earphone is worn by the user; and
the right earphone comprises a right-side hanger bar having first and second ends, wherein the first end of the right-side hanger bar is connected to the right-side body portion and the second end is free from physical connections, and wherein the right-side hanger bar is configured to extend from the right-side body portion over a top portion of the right ear of the user when the right earphone is worn by the user.

48. The earphones of claim 47, wherein the left-side and right-side hanger bars comprise plastic.

49. The earphones of claim 41, wherein:
the left-side SOC comprises a left-side buffer for caching audio content received wirelessly by the left earphone; and
the right-side SOC comprises a right-side buffer for caching audio content received wirelessly by the right earphone.

50. The earphones of claim 41, wherein the earphones are configured to, in response to detection of an incoming wireless communication to the user:
stop playing audio content streamed wirelessly to the earphones; and
output audio of the incoming wireless communication via the left-side speaker and the right-side speaker.

51. The earphones of claim 41, wherein the earphones are configured to, upon activation of a user control of the earphones, transmit data wirelessly about the earphones to a remote device.

52. The earphones of claim 41, wherein the earphones are configured to, upon activation of a user control of the earphones, initiate transmission of request to a remote network server.

53. The earphones of claim 41, further comprising a docking station for holding at least the left earphone, wherein the docking station comprises a power cable for connecting to an external device, and wherein the docking station is for charging at least the left earphone when the left earphone is placed in the docking station.

* * * * *